United States Patent
Shiota et al.

(10) Patent No.: US 10,747,113 B2
(45) Date of Patent: Aug. 18, 2020

(54) METHOD OF PATTERN FORMATION AND METHOD OF PRODUCING POLYSILANE RESIN PRECURSOR

(71) Applicant: TOKYO OHKA KOGYO CO., LTD., Kawasaki-shi (JP)

(72) Inventors: Dai Shiota, Kawasaki (JP); Hiroki Chisaka, Kawasaki (JP); Kunihiro Noda, Kawasaki (JP); Kazuya Someya, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 88 days.

(21) Appl. No.: 15/855,102

(22) Filed: Dec. 27, 2017

(65) Prior Publication Data

US 2018/0181002 A1 Jun. 28, 2018

(30) Foreign Application Priority Data

Dec. 28, 2016 (JP) .................. 2016-257076

(51) Int. Cl.
| | |
|---|---|
| *G03F 7/11* | (2006.01) |
| *G03F 7/075* | (2006.01) |
| *G03F 7/30* | (2006.01) |
| *C07F 7/08* | (2006.01) |
| *C09D 183/06* | (2006.01) |
| *C08G 77/18* | (2006.01) |
| *C09D 183/10* | (2006.01) |
| *G03F 7/32* | (2006.01) |
| *G03F 7/20* | (2006.01) |
| *C08G 77/42* | (2006.01) |

(52) U.S. Cl.
CPC ................ *G03F 7/11* (2013.01); *C07F 7/083* (2013.01); *C08G 77/18* (2013.01); *C09D 183/06* (2013.01); *C09D 183/10* (2013.01); *G03F 7/0752* (2013.01); *G03F 7/30* (2013.01); *C08G 77/42* (2013.01); *G03F 7/20* (2013.01); *G03F 7/327* (2013.01)

(58) Field of Classification Search
CPC .......... G03F 7/38; G03F 7/0752; G03F 7/075; G03F 7/011
USPC .......................................... 430/272.1, 273.1
See application file for complete search history.

(56) References Cited

U.S. PATENT DOCUMENTS

| | | | |
|---|---|---|---|
| 9,170,492 B2* | 10/2015 | Kawazu | C08G 77/04 |
| 2005/0058929 A1* | 3/2005 | Kennedy | C09D 5/006 |
| | | | 430/270.1 |
| 2005/0171277 A1* | 8/2005 | Li | G03F 7/0751 |
| | | | 524/588 |
| 2010/0248165 A1* | 9/2010 | Itai | G03B 27/32 |
| | | | 430/325 |
| 2014/0342289 A1* | 11/2014 | Ogihara | C08L 83/04 |
| | | | 430/281.1 |
| 2015/0253673 A1* | 9/2015 | Iwato | G03F 7/40 |
| | | | 430/18 |
| 2016/0096977 A1 | 4/2016 | Tachibana et al. | |
| 2018/0059547 A1* | 3/2018 | Cutler | G03F 7/0752 |

FOREIGN PATENT DOCUMENTS

JP 2016-74772 A 5/2016

* cited by examiner

*Primary Examiner* — John S Chu

(74) *Attorney, Agent, or Firm* — Knobbe, Martens, Olson & Bear LLP.

(57) ABSTRACT

A method of pattern formation. The method is capable of inhibiting a post-development residue from remaining on a support equipped with an electrode, and a method of producing a polysilane-polysiloxane resin precursor that is suitable for use in the method of pattern formation. The method of pattern formation includes forming a film of a silicon-containing composition on the support equipped with an electrode forming a film of a resin composition on the film of a silicon-containing composition, and forming the film of a resin composition into a pattern.

3 Claims, No Drawings

METHOD OF PATTERN FORMATION AND METHOD OF PRODUCING POLYSILANE RESIN PRECURSOR

RELATED APPLICATION

This application claims priority to Japanese Patent Application No. 2016-257076, filed Dec. 28, 2016, the content of which is incorporated herein by reference.

BACKGROUND OF THE INVENTION

Field of the Invention

The present invention relates to a method of pattern formation and a method of producing a polysilane-polysiloxane resin precursor that may be suitable for use in the method of pattern formation mentioned above.

Related Art

There is a trend toward finer fabrication of semiconductor substrates. In accordance with the trend, the patterning process conducted by a multilayered resist method requires removal of all the multiple resist underlayer films by dry etching after stripping the upper-layer resist with solvent; or removal of a silicon-containing resist underlayer film by wet etching with the use of, for example, a stripping liquid containing hydrofluoric acid. Such removal may cause damage to the substrate during the process. For example, Patent Document 1 suggests a composition for forming a coating type silicon-containing film that can be easily wet etched by a removing liquid which does not cause damage to a semiconductor substrate and a coating type organic film or a CVD film mainly consisting of carbon which are necessary in the patterning process. The fine patterning mentioned above is also required in the fabrication of such devices as touch panels, light-emitting devices (such as EL devices), display devices (such as liquid crystal display devices), and organic semiconductor devices, where the fine patterning is applied to the support (such as a substrate) equipped with a transparent electrode made of indium tin oxide (ITO) or the like.

Patent Document 1: Japanese Unexamined Patent Application, Publication No. 2016-74772

SUMMARY OF THE INVENTION

As a protective layer for protecting the support (such as a substrate) equipped with a transparent electrode from various treatments (such as exposure and development treatments during the patterning step) carried out in the fine patterning, a film of a silicon-containing composition has been studied. The support (such as a substrate) equipped with a transparent electrode is required to be highly transparent, and the transparency may be impaired by the presence of a post-development residue (for example, a post-development residue resulting from the exposure treatment or the development treatment), if any, generated on the transparent electrode on the support. Therefore, there is a demand for a patterning process that is capable of inhibiting a post-development residue from generating on a transparent electrode on a support.

The present invention has been devised based on the above circumstances, and an object of the present invention is to provide a method of pattern formation, the method being capable of inhibiting a post-development residue from generating on a support equipped with an electrode, and a method of producing a polysilane-polysiloxane resin precursor that may be suitable for use in the method of pattern formation mentioned above.

The inventors of the present invention have found that post-development residue generation can be inhibited by using a film of a silicon-containing composition as a protective layer for a support equipped with an electrode. Thus, the present invention has now been completed.

A first aspect of the present invention is a method of pattern formation, comprising:
a step of forming a film of a silicon-containing composition on a support equipped with an electrode;
a step of forming a film of a resin composition on the film of a silicon-containing composition; and
a step of forming the film of a resin composition into a pattern.

A second aspect of the present invention is a method of producing a polysilane-polysiloxane resin precursor, the method comprising treating at least one polysilane compound selected from the group consisting of polysilane compounds represented by the following formulae (A-2-1) and (A-2-2) under basic conditions:

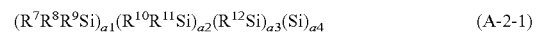

(in the formula, $R^7$, $R^8$, $R^9$, $R^{10}$, $R^{11}$ and $R^{12}$ each represent a hydrogen atom, a hydroxyl group, or an organic group; a1, a2, a3, and a4 each represent a molar fraction; and relationships a1+a2+a3+a4=1, 0≤a1≤1, 0≤a2≤1, 0≤a3≤1, and 0≤a4≤1 are satisfied)

[Chem. 1]

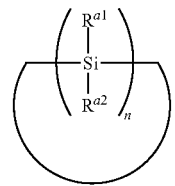

(A-2-2)

(in the formula (A-2-2), $R^{a1}$ and $R^{a2}$ each independently represent a hydrogen atom, a hydroxyl group, or an organic group; and n represents an integer of 3 to 20).

The present invention can provide a method of pattern formation, the method being capable of inhibiting a post-development residue from generating on a support equipped with an electrode, and a method of producing a polysilane-polysiloxane resin precursor that may be suitable for use in the method of pattern formation mentioned above.

DETAILED DESCRIPTION OF THE INVENTION

Next, aspects of the present invention will be described in detail. The scope of the present invention, however, is not limited to these aspects, and the present invention may be implemented with appropriate modification without departing from the purpose of the present invention. In the present specification, the term "(a certain value) to (another certain value)" refers to any value that is not less than that certain value and not more than that another certain value, unless otherwise indicated.

«Method of Pattern Formation»

A method of pattern formation according to a first aspect comprises:

a step of forming a film of a silicon-containing composition on a support equipped with an electrode (hereinafter, the step is also called "step 1");

a step of forming a film of a resin composition on the film of a silicon-containing composition (hereinafter, the step is also called "step 2"); and a step of forming the film of a resin composition into a pattern (hereinafter, the step is also called "step 3"). It is preferable that the method according to the first aspect further comprises a step of (partially) removing the film of a silicon-containing composition along the pattern of the film of a resin composition (hereinafter, the step is also called "step 4"). In the first aspect, the step 3 of forming the film of a resin composition into a pattern may be preferably carried out simultaneously with the step 4 of removing the film of a silicon-containing composition along the pattern of the film of a resin composition. The specific procedure may be as follows: after selective exposure of the film of a resin composition through a mask is completed, development is carried out to form the film of a resin composition into a pattern and at the same time remove the film of a silicon-containing composition along the resulting pattern. This procedure may simplify steps of the method of pattern formation.

<Step 1>

The film of a silicon-containing composition formed in the step 1 may be capable of functioning as a protective layer for the support equipped with an electrode. The method of forming the film of a silicon-containing composition on the support equipped with an electrode is not particularly limited as long as the effects of the present invention are not impaired, but it is preferable to form the film of a silicon-containing composition by applying a silicon-containing composition to the support. Examples of such a method include coating with the use of a contact-transfer-type coating apparatus such as a roll coater, a reverse coater, or a bar coater or a non-contact-type coating apparatus such as a spinner (a spin coating apparatus) or a curtain flow coater.

After coating, it is preferable to dry (pre-bake) the resulting coating of the silicon-containing composition. The method of drying is not particularly limited, and examples of the method include (1) drying on a hot plate at a temperature of 60 to lower than 200° C., preferably 80 to 120° C., and more preferably 90 to 100° C., for 60 to 120 seconds, (2) leaving the coating to itself at room temperature for several hours to several days, and (3) placing the coating in a warm-air heater or an infrared heater for several dozen minutes to several hours for removal of solvent. After drying, the resulting coating of the silicon-containing composition may or may not be subjected to exposure by irradiation of an active energy ray such as ultraviolet light or excimer laser light. The dose of the active energy ray is not particularly limited, but may be about 30 to about 2000 mJ/cm², for example. After drying or exposing, the resulting coating of the silicon-containing composition may be subjected to baking (post-baking). The baking temperature depends on the type of the substrate underneath, and is in the range of 200 to 1000° C., for example, preferably in the range of 200° C. to 600° C., more preferably in the range of 200 to 250° C., and further preferably in the range of 210° C. to 240° C. The atmosphere for the baking is not particularly limited, and the baking may be carried out in an inert gas atmosphere such as a nitrogen atmosphere or an argon atmosphere, in a vacuum, or under reduced pressure. The baking may be carried out in the atmosphere or with appropriate control of the oxygen concentration. The time for the baking may be selected as appropriate, and is from about 10 minutes to about 120 minutes.

The thickness of the film of a silicon-containing composition formed by this procedure is 10 nm to 10000 nm, for example, preferably 50 nm to 5000 nm, and more preferably 100 nm to 3000 nm.

(Electrode)

The electrode may be either a positive electrode (cathode) or a negative electrode (anode) with no particular limitation as long as the effects of the present invention are not impaired. Examples of the electrode include transparent electrodes in touch panels, light-emitting devices (such as EL devices), display devices (such as liquid crystal display devices), and organic semiconductor devices, metal electrodes containing a metal such as gold, platinum, chromium, palladium, aluminum, indium, molybdenum, or nickel, alloy electrodes containing these metals, polysilicon electrodes, and amorphous silicon electrodes. These electrodes may be made of a combination of two or more of those constituent electrode materials. The electrode may have been formed into a stripe pattern or other patterns. Specific examples of the transparent electrode include indium tin oxide (ITO) electrode, indium zinc oxide (IZO) electrode, and zinc oxide (ZO) electrode.

(Support)

The support equipped with the electrode is not particularly limited as long as the effects of the present invention are not impaired, and examples thereof include glass substrates, quartz substrates, transparent or translucent resin substrates (made of, for example, a heat-resistant material such as polycarbonate, polyethylene terephthalate, polyether sulfone, polyimide, or polyamide-imide), metal substrates, and silicon substrates. The support equipped with the electrode may be any of various substrates including semiconductor substrates, substrates of display components such as liquid crystal displays, organic light-emitting displays (OLEDs), electrophoretic displays (electronic paper), touch panels, color filters, and backlights, substrates of solar cells, substrates of photoelectric conversion devices such as optical sensors, and substrates of photoelectric devices. The thickness of the support is not particularly limited and may be selected as appropriate depending on how the patterned substrate is to be used.

(Film of Silicon-Containing Composition)

In order to make it possible to carry out the removal not by etching treatment but by, for example, a relatively moderate development treatment by using the pattern of the film of a resin composition as a mask, it is preferable that the film of a silicon-containing composition contains at least one selected from the group consisting of polysilane-polysiloxane resins composed of a polysilane backbone and a polysiloxane backbone linked together, and hydrolysis-condensation products of at least one alkoxysilane including a compound represented by the following formula (I):

$$HOOC—X—Z—Y—Si(OR^a)_3 \qquad (I)$$

(in the formula (I), X represents a divalent group obtained by removing one hydrogen atom each from two ring carbon atoms of an aromatic ring group or of an alicyclic group, or an alkylene group optionally having a branched chain and/or a double bond; Z represents —NHCO— or —CONH—; Y represents a single bond, an alkylene group, an arylene group, or —$R^{Y1}$—NH—$R^{Y2}$— (wherein $R^{Y1}$ and $R^{Y2}$ independently represent an alkylene group); $R^a$ independently represents a hydrocarbon group; and X and/or Y optionally has, as a substituent, at least one group selected from the group consisting of a (meth)acrylic group, a vinyl group, and an epoxy group).

<Silicon-Containing Composition>

The silicon-containing composition used in the first aspect is not particularly limited as long as it is a silicon-atom-containing composition that does not impair the effects of the present invention. It is preferable that the silicon-containing composition contains at least one selected from the group consisting of:

polysilane-polysiloxane resins composed of a polysilane backbone and a polysiloxane backbone linked together;
compounds represented by the formula (I); and
hydrolyzed products, condensates, or hydrolysis-condensation products of at least one alkoxysilane including a compound represented by the formula (I).

(Polysilane-Polysiloxane Resin Composed of Polysilane Backbone and Polysiloxane Backbone Linked Together)

The polysilane-polysiloxane resin that may be contained in the silicon-containing composition is preferably a polysilane-polysiloxane resin that is composed of a polysilane backbone and a polysiloxane backbone linked together with an oxygen atom interposed therebetween (namely, via an ether bond (—O—)). In the polysilane-polysiloxane resin used in the first aspect, the bond (such as an ether bond) binding the polysilane backbone to the polysiloxane backbone is unstable compared to the Si—Si bond in the polysilane backbone or the Si—O bond in the polysiloxane backbone and, therefore, tends to break with the action of an alkali developing solution. This tendency obtainable with the use of the polysilane-polysiloxane resin allows alkali development to proceed well and, therefore, potentially reduces post-development residue generation.

Alternatively, the silicon-containing composition may be a radiation-sensitive composition. Examples of the source of the radiation include ultraviolet light sources, active energy ray sources such as excimer laser light sources, and ultraviolet light sources such as high-pressure mercury lamps, ultrahigh-pressure mercury lamps, xenon lamps, and carbon arc lamps. The silicon-containing composition may be either a positive-type radiation-sensitive composition or a negative-type radiation-sensitive composition, but in the case in which the polysilane-polysiloxane resin is contained, the silicon-containing composition is preferably a positive-type radiation-sensitive composition. From the viewpoint of alkali development, the polysilane-polysiloxane resin preferably contains at least one structure selected from the group consisting of structures represented by the following formulae (H1) and (H2):

[Chem. 2]

(H1)

(H2)

(in the formulae (H1) and (H2), $A^1$ each independently represents a polysiloxane backbone that contains at least one structure represented by the following formula (A1) including at least one leftmost structure in the same formula; -$A^2O$— each independently represents a linking group selected from structures represented by the following formula (A2); -$OA^2$- in the formula (H1) represents an —OSi— structure, which is equivalent to the —SiO— main chain in the following formula (A1) with the inverted order of bonding; Psi represents a polysilane backbone;

and * represents the position of a potential bond)

[Chem. 3]

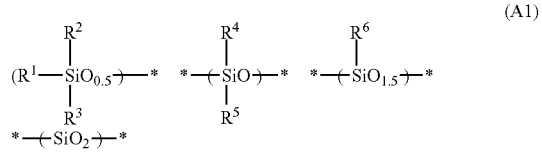
(A1)

[Chem. 4]

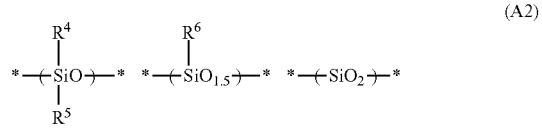
(A2)

(in the formulae (A1) and (A2), $R^1$, $R^2$, $R^3$, $R^4$, $R^5$, and $R^6$ each independently represent a hydrogen atom or an organic group; a hydrogen atom in the organic group is optionally substituted with a halogen atom;

and * represents the position of a potential bond).

For easy removal of the film of the silicon-containing composition, the polysilane backbone represented by Psi is a polysilane backbone having 3 to 40 Si atoms, for example, and preferably a polysilane backbone having 5 to 30 Si atoms. The polysilane backbone represented by Psi preferably contains at least one structure represented by the following formula (B1):

[Chem. 5]

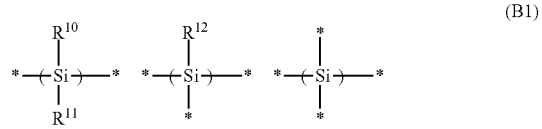
(B1)

(in the formula (B1), $R^{10}$, $R^{11}$, and $R^{12}$ independently represent a hydrogen atom, a hydroxyl group, or an organic group;

and * represents the position of a potential bond). More preferably, the polysilane backbone represented by Psi contains a structure represented by the following formula (B1-1):

[Chem. 6]

(B1-1)

(in the formula (B1-1), *, $R^{10}$, and $R^{11}$ represent the same as those defined for the formula (B1)).

A specific example of structures represented by the formula (H1) is a structure represented by the following formula (H3):

[Chem. 7]

(H3)

(in the formula (H3), $A^1$, $-A^2O$, $-OA^2-$, and Psi represent the same as those defined for the formula (H1)).

Examples of the organic groups represented by $R^1$ to $R^6$ and $R^{10}$ to $R^{12}$ include $C_{1-30}$ organic groups such as alkyl groups [$C_{1-10}$ alkyl groups such as a methyl group, an ethyl group, an n-propyl group, an i-propyl group, an n-butyl group, and a t-butyl group (preferably $C_{1-6}$ alkyl groups, and particularly preferably $C_{1-4}$ alkyl groups, for example)], cycloalkyl groups ($C_{5-8}$ cycloalkyl groups, and particularly preferably $C_{5-6}$ cycloalkyl groups, such as a cyclohexyl group), alkenyl groups [$C_{2-10}$ alkenyl groups such as an ethenyl group, a propenyl group, and a butenyl group (preferably $C_{2-6}$ alkenyl groups, and particularly preferably $C_{2-4}$ alkenyl groups, for example)], cycloalkenyl groups [$C_{5-10}$ cycloalkenyl groups such as a 1-cyclopentenyl group and a 1-cyclohexenyl group (preferably $C_{5-8}$ cycloalkenyl groups, and particularly preferably $C_{5-7}$ cycloalkenyl groups, for example)], aryl groups ($C_{6-10}$ aryl groups such as a phenyl group and a naphthyl group), aralkyl groups [$C_{6-10}$-aryl $C_{1-6}$-alkyl groups such as a benzyl group and a phenethyl group ($C_{6-10}$-aryl $C_{1-4}$-alkyl groups, for example)], an amino group, and N-substituted amino groups (such as N-mono- or -di-substituted amino groups substituted, for example, with the above alkyl groups, the above cycloalkyl groups, the above aryl groups, the above aralkyl groups, and/or acyl groups). The alkyl groups, the cycloalkyl groups, the aryl groups, the aryl groups contained in the aralkyl groups, or other groups may have one substituent or a plurality of substituents. Examples of the substituents include the alkyl groups described above (particularly $C_{1-6}$ alkyl groups, for example). Examples of the organic groups having such substituents include $C_{1-6}$-alkyl $C_{6-10}$-aryl groups such as a tolyl group, a xylenyl group, an ethylphenyl group, and a methylnaphthyl group (preferably mono-, di-, or tri-$C_{1-4}$-alkyl $C_{6-10}$-aryl groups, and particularly preferably mono- or di-$C_{1-4}$-alkylphenyl groups, for example).

The mass average molecular weight (Mw) of the polysilane-polysiloxane resin is not particularly limited as long as the purpose of the present invention is not impaired, but is preferably 500 to 20000, more preferably 1000 to 10000, and further preferably 2000 to 8000. In the present specification, the mass average molecular weight (Mw) refers to a value in terms of polystyrene measured by gel permeation chromatography (GPC).

(Method of Producing Polysilane-Polysiloxane Resin)

The polysilane-polysiloxane resin composed of a polysilane backbone and a polysiloxane backbone linked together may be produced by performing hydrolysis-condensation reaction of at least one selected from the group consisting of silicon compounds represented by the following formulae (A-1-1) to (A-1-4) and the formula (I) and hydrolyzed products, condensates, and hydrolysis-condensation products of at least one silicon compound selected from the group consisting of silicon compounds represented by the following formulae (A-1-1) to (A-1-4) and the formula (I); and at least one polysilane compound selected from the group consisting of polysilane compounds represented by the following formulae (A-2-1) and (A-2-2):

$R^1R^2R^3SiOR$ (A-1-1)

$R^4R^5Si(OR)_2$ (A-1-2)

$R^6Si(OR)_3$ (A-1-3)

$Si(OR)_4$ (A-1-4)

(in the formulae, R each independently represents a hydrocarbon group; $R^1$, $R^2$, $R^3$, $R^4$, $R^5$, and $R^6$ each independently represent a hydrogen atom or an organic group; and a hydrogen atom in the organic group is optionally substituted with a halogen atom)

$(R^7R^8R^9Si)_{a1}(R^{10}R^{11}Si)_{a2}(R^{12}Si)_{a3}(Si)_{a4}$ (A-2-1)

(in the formula, $R^7$, $R^8$, $R^9$, $R^{10}$, $R^{11}$, and $R^{12}$ each independently represent a hydrogen atom, a hydroxyl group, or an organic group;

a1, a2, a3, and a4 each represent a molar fraction; and relationships $a1+a2+a3+a4=1$, $0 \leq a1 \leq 1$, $0 \leq a2 \leq 1$, $0 \leq a3 \leq 1$, and $0 \leq a4 \leq 1$ are satisfied)

[Chem. 8]

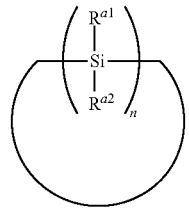

(A-2-2)

(in the formula (A-2-2), $R^{a1}$ and $R^{a2}$ each independently represent a hydrogen atom, a hydroxyl group, or an organic group;

and n represents an integer of 3 to 20). Examples of the organic groups represented by $R^7$ to $R^{12}$, $R^{a1}$, and $R^{a2}$ include the same groups as those defined in the specific examples and preferable examples of the organic groups represented by $R^1$ to $R^6$ and $R^{10}$ to $R^{12}$. The organic groups represented by $R^7$ to $R^6$, $R^{a1}$, and $R^{a2}$ may be any organic groups, and may be introduced by the method described in, for example, paragraph 0031 of Japanese Unexamined Patent Application, Publication No. 2003-261681.

More specifically, the polysiloxane backbone of the polysilane-polysiloxane resin may be formed by hydrolysis-condensation reaction of a mixture containing at least one silicon compound selected from the group consisting of silicon compounds represented by the formulae (A-1-1) to (A-1-4) and silicon compounds represented by the formula (I). The polysilane backbone of the polysilane-polysiloxane resin may be formed using at least one polysilane compound selected from the group consisting of polysilane compounds represented by the formulae (A-2-1) and (A-2-2).

The conditions of the hydrolysis-condensation reaction are not particularly limited as long as the hydrolysis-condensation reaction is allowed to proceed. For example, the hydrolysis-condensation reaction may be carried out using an acid catalyst that is one or more compounds selected from inorganic acids, aliphatic sulfonic acids, and aromatic sulfonic acids. Examples of the acid catalyst used in this case include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The amount of the catalyst used is preferably $10^{-6}$ to 10 mol, more preferably $10^{-5}$ to 5 mol, and further preferably $10^{-4}$ to 1 mol, relative to 1 mol of the silicon compound represented by the formulae (A-1-1) to (A-1-4).

The amount of water added in the hydrolysis-condensation of the silicon compound represented by the formulae (A-1-1) to (A-1-4) is preferably 0.01 to 100 mol, more preferably 0.05 to 50 mol, and further preferably 0.1 to 30 mol, relative to 1 mol of a hydrolyzable substituent in the silicon compound represented by the formulae (A-1-1) to (A-1-4). The reaction temperature is preferably 0 to 100° C., and more preferably 5 to 80° C.

A preferable organic solvent to add to an aqueous solution of the catalyst is, for example, methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, or a mixture of these.

Among these, water-soluble solvents are more preferable. Examples thereof include alcohols such as methanol, ethanol, 1-propanol, and 2-propanol, polyhydric alcohols such as ethylene glycol and propylene glycol, polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether, acetone, acetonitrile, and tetrahydrofuran. Among these, those with a boiling point of 100° C. or less are particularly preferable.

The amount of the organic solvent to add is preferably 0 to 1,000 mL, and particularly preferably 0 to 500 mL, relative to 1 mol of the silicon compound represented by the formulae (A-1-1) to (A-1-4).

Subsequently, reaction of neutralization of the catalyst may be carried out if necessary so as to remove under reduced pressure the alcohol generated from the hydrolysis-condensation reaction and obtain an aqueous solution of the reaction mixture.

It is particularly preferable that the silicon compound represented by the formulae (A-1-1) to (A-1-4) be, for example, tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, tolyltrimethoxysilane, tolyltriethoxysilane, anisyltrimethoxysilane, anisyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, or dimethylphenethylmethoxysilane.

The polysilane compound represented by the formula (A-2-1) or (A-2-2) may be prepared by various methods of polysilane production or by a modification of these methods. Examples of these methods include (a) dehalogenation condensation polymerization of a halosilane with the use of magnesium as a reducing agent (for example, "magnesium reduction method" and methods described in WO98/29476 and Japanese Unexamined Patent Application, Publication No. 2003-277507), (b) reductive coupling carried out by vigorously stirring a dialkyldihalosilane or a dihalotetraalkyldisilane in the solvent toluene at a temperature of 100° C. or more with the use of an alkali metal such as metallic sodium [J. Am. Chem. Soc., 103 (1981) 7352], (c) anionic polymerization of a disilene that is masked with biphenyl or the like (Japanese Unexamined Patent Application, Publication No. H1-23063), (d) ring-opening polymerization of a cyclic silane (Japanese Unexamined Patent Application, Publication No. H5-170913), (e) dehydrogenation condensation polymerization of a hydrosilane with the use of a transition metal complex catalyst (Japanese Examined Patent Application, Publication No. H7-17753), and (f) electrode reduction of a dihalosilane at a temperature equal to or lower than room temperature to produce polysilane (Japanese Unexamined Patent Application, Publication No. H7-309953). A preferable method is magnesium reduction.

It is preferable to produce the polysilane compound represented by the formula (A-2-1) or (A-2-2) with the use of a solvent containing a cycloalkyl acetate represented by the following formula (S1):

[Chem. 9]

(S1)

(in the formula (S1), Rs1 represents a $C_{1-3}$ alkyl group; p represents an integer of 1 to 6; and q represents an integer of 0 to (p+1)).

Specific examples of the cycloalkyl acetate represented by the formula (S1) include cyclopropyl acetate, cyclobutyl acetate, cyclopentyl acetate, cyclohexyl acetate, cycloheptyl acetate, and cyclooctyl acetate. Among these, cyclooctyl acetate is preferable because it is readily available and likely to improve polymerizing activity of a halosilane compound. The solvent used in the reaction may contain a combination of two or more types of the cycloalkyl acetate represented by the formula (S1).

The polysilane compound represented by the formula (A-2-1) or (A-2-2) may also be a commercially available product such as Ogsol SI-10-10 (polymethylphenylsilane), SI-10-20 (polymethylphenylsilane), SI-20-10 (polyphenylsilane), SI-20-10 (modified) (polyphenylsilane), and SI-30-10(cyclic polydiphenylsilane), all manufactured by Osaka Gas Chemicals Co., Ltd. Before use, these commercially available products may be subjected to reaction under the following basic conditions for molecular weight reduction.

The at least one polysilane compound, selected from the group consisting of polysilane compounds represented by the formulae (A-2-1) and (A-2-2), for use in the production of the polysilane-polysiloxane resin is preferably produced by a method of producing a polysilane-polysiloxane resin precursor according to a second aspect. The polysilane-polysiloxane resin precursor refers to the polysilane compound for use in the production of the polysilane-polysiloxane resin. The method of producing a polysilane-polysiloxane resin precursor according to the second aspect comprises treating the at least one polysilane compound selected from the group consisting of polysilane compounds represented by the formulae (A-2-1) and (A-2-2) under basic conditions. In the production of the polysilane-polysiloxane resin, by carrying out treatment (such as purification treatment) of the polysilane compound under basic conditions before hydrolysis-condensation reaction of the polysilane compound with at least one selected from the group consisting of silicon compounds represented by the formulae (A-1-1) to (A-1-4) and the formula (I) and hydrolyzed products, condensates, and hydrolysis-condensation products of at least one silicon compound selected from the group consisting of silicon compounds represented by the formulae (A-1-1) to (A-1-4) and the formula (I), it is possible to remove foreign matter such as a halogen atom (for example, a halogen ion (such as chloride ion) and Si—Cl remaining in the polysilane compound) and also facilitate reduction of the molecular weight of the polysilane compound, leading to improved solubility of the polysilane compound in solvent. The resulting polysilane compound may be suitably used in the production of the polysilane-polysiloxane resin.

The base used here may be any of various basic compounds, and examples thereof include inorganic bases such as sodium hydroxide, potassium hydroxide, barium hydroxide, ammonia, tetramethylammonium hydroxide, sodium carbonate, sodium hydrogen carbonate, potassium carbonate, lithium hydride, sodium hydride, potassium hydride, and calcium hydride, metal alkyls such as methyllithium, n-butyllithium, methyl magnesium chloride, and ethyl magnesium bromide, metal halides containing metals (or ions of metals) such as Cr, Ga, Fe(Fe (II), Fe (III)), Cd, Co, Ni, Sn, Pb, Cu (Cu (II), Cu (I)), Ag, Pd, Pt, and Au, alkoxides such as sodium methoxide, sodium ethoxide, and potassium t-butoxide, and organic bases such as triethylamine, diisopropylethylamine, N,N-dimethylaniline, pyridine, 4-dimethylaminopyridine, and diazabicycloundecene (DBU). The reaction temperature is preferably −50° C. to about the boiling point of the solvent, and further preferably room temperature to 100° C.

The solvent used in the treatment under basic conditions may be any of various solvents, and, for example, may be one or more solvents selected from hydrocarbon solvents such as benzene, toluene, and xylene, glycol solvents such as propylene glycol monomethyl ether and propylene glycol monoethyl ether, ether solvents such as diethyl ether, diisopropyl ether, dibutyl ether, tetrahydrofuran, and 1,4-dioxane, ketone solvents such as acetone, methyl ethyl ketone, methyl isobutyl ketone, methyl amyl ketone, cyclopentanone, and cyclohexanone, and alcohol solvents such as ethanol, isopropyl alcohol, and butanol.

It may also be preferable to use a cycloalkyl acetate represented by the formula (S1).

(Compound Represented by Formula (I))

The silicon-containing composition may contain a compound represented by the following formula (I) or a hydrolyzed product, a condensate, or a hydrolysis-condensation product of at least one alkoxysilane including a compound represented by the following formula (I), and preferably contains a compound represented by the following formula (I) or a hydrolyzed product, a condensate, or a hydrolysis-condensation product of a compound represented by the following formula (I):

HOOC—X—Z—Y—Si(OR$^a$)$_3$ (I)

(in the formula (I), X represents a divalent group obtained by removing one hydrogen atom each from two ring carbon atoms of an aromatic ring group or of an alicyclic group or an alkylene group optionally having a branched chain and/or a double bond; Z represents —NHCO— or —CONH—; Y represents a single bond, an alkylene group, an arylene group, or —R$^{Y1}$—NH—R$^{Y2}$— (wherein R$^{Y1}$ and R$^{Y2}$ independently represent an alkylene group); R$^a$ independently represents a hydrocarbon group; and X and/or Y optionally has, as a substituent, at least one group selected from the group consisting of a (meth)acrylic group, a vinyl group, and an epoxy group).

The compound represented by the formula (I) in the first aspect may receive intramolecular imidization due to heat or the like. This process leads to H$_2$O generation, which leads to formation of silanol structure and then condensation. For this reason, a compound represented by the formula (I) or a hydrolyzed product, a condensate, or a hydrolysis-condensation product of at least one alkoxysilane including a compound represented by the formula (I) when contained in the silicon-containing composition may be capable of inhibiting dissolution of the film of the silicon-containing composition in an alkali developing solution. In the case in which the silicon-containing composition contains a compound represented by the formula (I) or a hydrolyzed product, a condensate, or a hydrolysis-condensation product of at least one alkoxysilane including a compound represented by the formula (I), the silicon-containing composition may be either a positive-type radiation-sensitive composition or a negative-type radiation-sensitive composition and is preferably a negative-type radiation-sensitive composition.

Examples of the aromatic ring in X include C$_{6-10}$ aromatic rings (such as a benzene ring, a naphthalene ring, a tolyl group, and a xylyl group) optionally having a C$_{1-2}$ substituent. Examples of the alicyclic group in X include C$_{5-10}$ alicyclic groups (examples thereof include monocyclic cycloalkyl groups, monocyclic cycloalkenyl groups, dicyclic alkyl groups, and cage-like alkyl groups, and specific examples thereof include a cyclopentane ring, a cyclohexane ring, a cycloheptane ring, a cyclooctane ring, a cyclononane ring, a cyclodecane ring, a dicyclopentadiene ring, a norbornane ring, a norbornene ring, a cubane ring, and a basketane ring). Examples of the alkylene group optionally having a branched chain and/or a double bond in X include C$_{1-4}$ alkylene groups, including alkylene groups such as a methylene group, an ethylene group, a propylene group, a vinylene group, a (2-octenyl) ethylene group, and a (2,4,6-trimethyl-2-nonenyl) ethylene group, alkylene groups having a double bond, and alkylene groups having a C$_{1-9}$ branched chain.

Examples of the alkylene group in Y include C$_{1-6}$ alkylene groups, and examples thereof include a methylene group, an ethylene group, a propylene group, and a butylene group. The arylene group in Y preferably has 6 to 10 carbon atoms. Examples of such an arylene group include phenylene groups (o-, m-, and p-phenylene groups, for example) and naphthylene groups (1,4-, 1,5-, and 2,6-naphthylene groups, for example). Specific examples of —R$^{Y1}$—NH—R$^{Y2}$— in Y include —CH$_2$—NH—CH$_2$—, —(CH$_2$)$_2$—NH—(CH$_2$)$_2$—, —(CH$_2$)$_3$—NH—(CH$_2$)$_3$—, —CH$_2$—NH—(CH$_2$)$_2$—, —(CH$_2$)$_2$—NH—CH$_2$—, —(CH$_2$)$_2$—NH—(CH$_2$)$_3$—, —(CH$_2$)$_3$—NH—(CH$_2$)$_2$—, —CH$_2$—NH—(CH$_2$)$_3$—, and —(CH$_2$)$_3$—NH—CH$_2$—.

Examples of the combination of X, Z, and Y in the formula (I) are shown in Table 1 below. In the table, the preferred number of bonds of Xs is two, one of which is for bonding to COOH and the other of which is for bonding to Z. Z in Table 1 is bonded to X and Y in the same manner.

including a compound represented by the formula (I) is not particularly limited as long as the purpose of the present invention is not impaired, but is preferably 500 to 20000, more preferably 1000 to 10000, and further preferably 2000 to 8000.

TABLE 1

| | Y | Z | X |
|---|---|---|---|
| 1 | —(CH$_2$)$_3$— | —NHCO— | 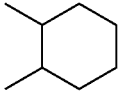 |
| 2 | —(CH$_2$)$_3$— | —NHCO— | 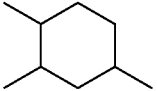 |
| 3 | —(CH$_2$)$_3$— | —NHCO— | 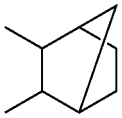 |
| 4 | —(CH$_2$)$_3$— | —NHCO— | 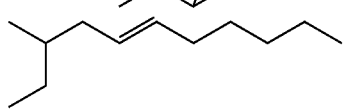 |
| 5 | —(CH$_2$)$_3$— | —NHCO— | 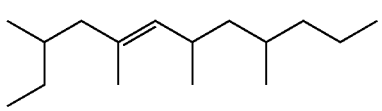 |
| 6 | —(CH$_2$)$_3$— | —NHCO— | 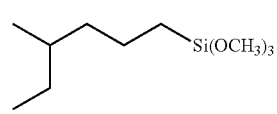 |
| 7 | —(CH$_2$)$_3$NH(CH$_2$)$_2$— | —NHCO— | 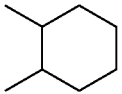 |
| 8 | —(CH$_2$)$_3$NH(CH$_2$)$_2$— | —NHCO— | 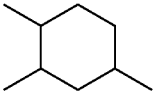 |
| 9 | —(CH$_2$)$_3$NH(CH$_2$)$_2$— | —NHCO— | 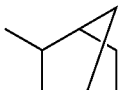 |
| 10 | —(CH$_2$)$_3$NH(CH$_2$)$_2$— | —NHCO— | 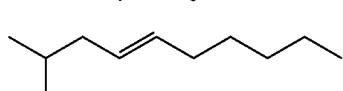 |
| 11 | —(CH$_2$)$_3$NH(CH$_2$)$_2$— | —NHCO— | 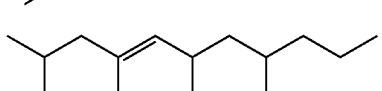 |
| 12 | —(CH$_2$)$_3$NH(CH$_2$)$_2$— | —NHCO— | 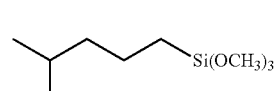 |

The mass average molecular weight (Mw) of the hydrolysis-condensation product of at least one alkoxysilane The conditions of the hydrolysis reaction, the condensation reaction, or the hydrolysis-condensation reaction of at least one alkoxysilane including a compound represented by the formula (I) are not particularly limited as long as the hydrolysis-condensation reaction is allowed to proceed, and may be any known conditions. The reaction may adopt the use of a catalyst, and examples of the catalyst include tetrabutylammonium hydroxide, benzyltrimethylammonium hydroxide, benzyltriethylammonium hydroxide, tetramethylammonium hydroxide, tetrabutylammonium hydroxide, hydrochloric acid, sulfuric acid, formic acid, and oxalic acid. The reaction conditions may include a duration of 1 to 10 hours and a temperature of 25 to 100° C., for example.

<Solvent>

The silicon-containing composition used in the first aspect preferably contains a solvent. Examples of the solvent include cycloalkyl acetates represented by the formula (S1); alcohols such as methanol, ethanol, propanol, and n-butanol; polyhydric alcohols such as ethylene glycol, diethylene glycol, propylene glycol, and dipropylene glycol;

ketones such as acetone, methyl ethyl ketone, cyclohexanone, methyl-n-amyl ketone, methyl isoamyl ketone, and 2-heptanone; lactone-ring-containing organic solvents such as γ-butyrolactone;

polyhydric alcohol derivatives, including ester-bond-containing compounds such as ethylene glycol monoacetate, diethylene glycol monoacetate, propylene glycol monoacetate, and dipropylene glycol monoacetate and ether-bond-containing compounds such as monoalkyl ethers (for example, monomethyl ether, monoethyl ether, monopropyl ether, and monobutyl ether) and monophenyl ethers of the above polyhydric alcohols and the above ester-bond-containing compounds;

cyclic ethers such as dioxane and esters such as methyl lactate, ethyl lactate, methyl acetate, ethyl acetate, butyl acetate, methyl pyruvate, ethyl pyruvate, methyl methoxypropionate, and ethyl ethoxypropionate;

aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene, and mesitylene;

and nitrogen-containing organic solvents such as N,N,N',N'-tetramethylurea, N,N,2-trimethylpropionamide, N,N-dimethylacetamide, N,N-dimethylformamide, N,N-diethylacetamide, N,N-diethylformamide, 1,3-dimethyl-2-imidazolidinone, N-methylpyrrolidone, and N-ethylpyrrolidone.

Among these, cycloalkyl acetates represented by the formula (S1), propylene glycol monomethyl ether acetate (PGMEA), propylene glycol monomethyl ether (PGME), N,N,N',N'-tetramethylurea (TMU), and butanol are preferable. These solvents may be used as a combination of two or more of these.

For crack inhibition, the moisture content of the silicon-containing composition is preferably 1.0% by mass or less, more preferably 0.5% by mass or less, further preferably 0.3% by mass or less, and particularly preferably lower than 0.3% by mass. The moisture content in the solvent may be measured by Karl Fischer measurement. Moisture in the silicon-containing composition is often attributable to the solvent. For this reason, it is preferable that the solvent has been dehydrated so as to achieve the above moisture content of the silicon-containing composition.

The amount of the solvent to add is not particularly limited as long as the purpose of the present invention is not impaired. From the viewpoint of film formation, the amount of the solvent to add is determined so as to achieve a solid content of the silicon-containing composition of preferably 1 to 50% by mass, and more preferably 10 to 40% by mass.

<Additional Components>

The silicon-containing composition used in the first aspect may contain an organic compound having two or more hydroxyl groups or two or more carboxy groups per molecule. Examples of the organic compound include the following compounds.

[Chem. 10]

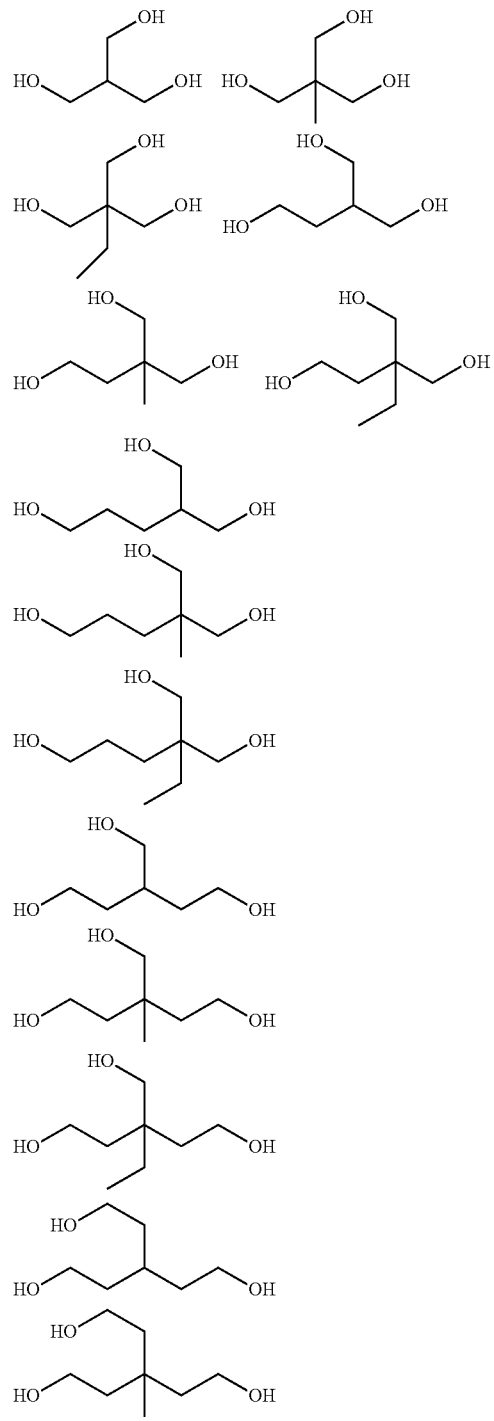

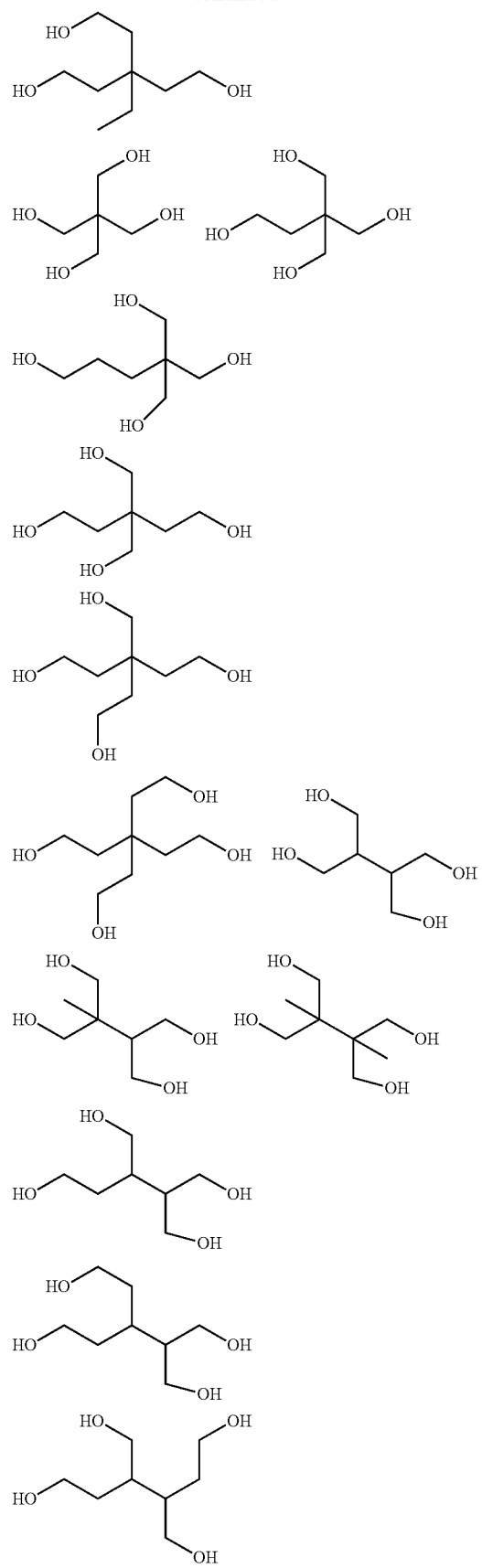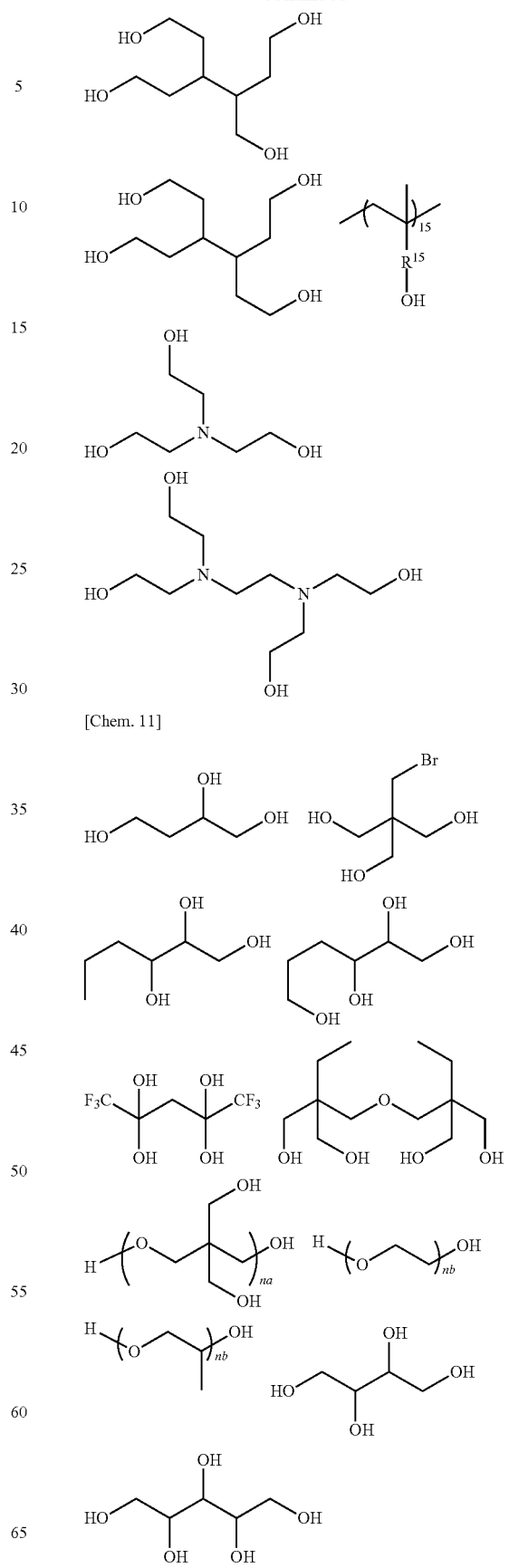

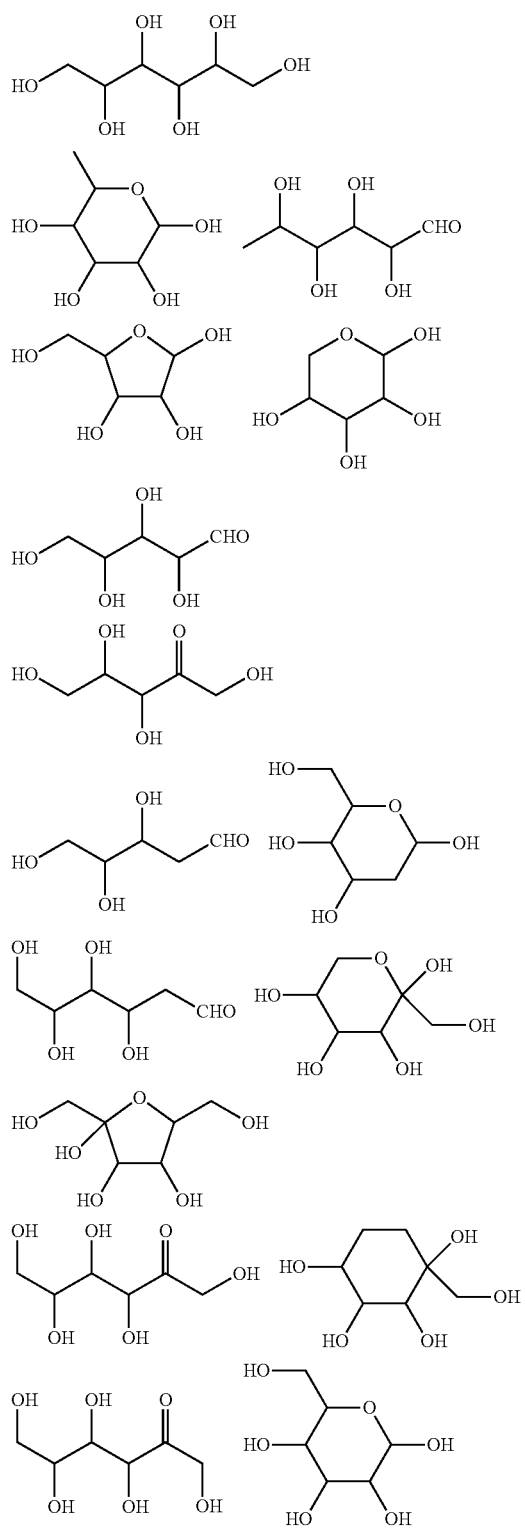
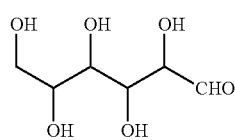
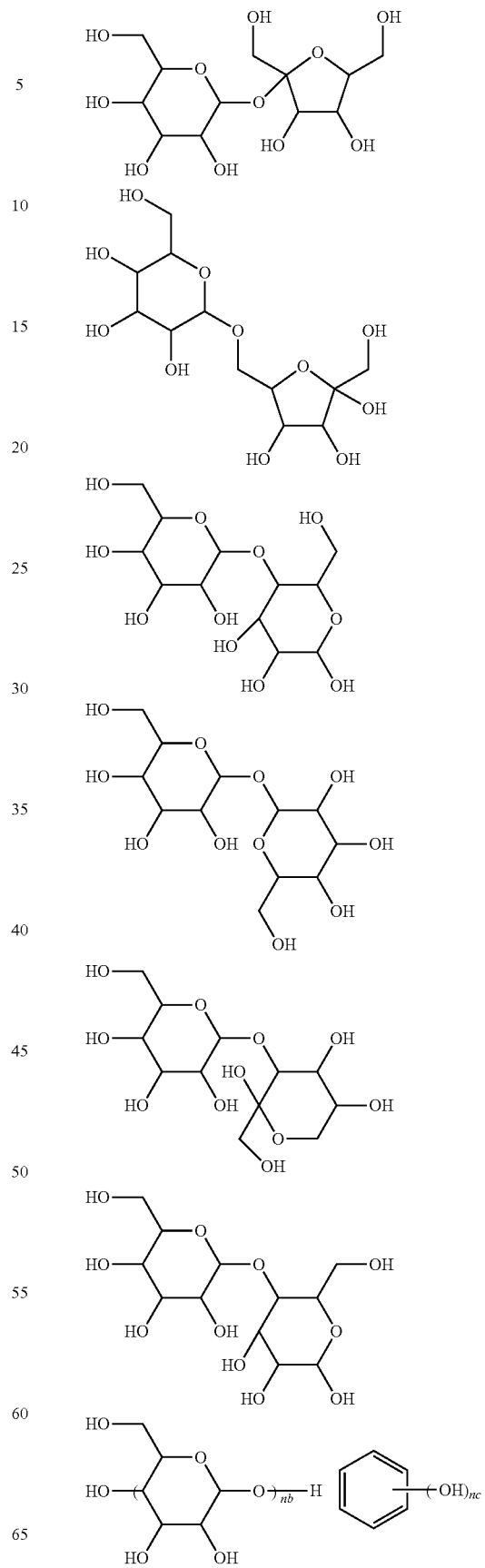

-continued

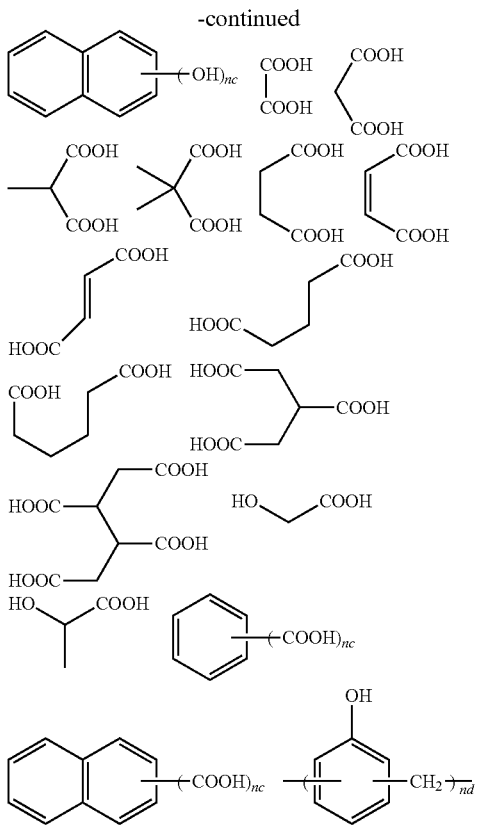

In the above structural formulae, E represents a hydrogen atom, a methyl group, or a hydroxymethyl group; $R^{15}$ represents a methylene group, a carbonyl group, or a phenylene group; n represents an integer of 3 or more and smaller than 100; na represents a natural number of 1 to 3; nb represents a natural number of 1 or more; nc represents a natural number of 2 to 4; and nd represents a natural number of 2 or more. There may be enantiomers and diastereomers of these structural formulae. Each of these structural formulae represents all of such stereoisomers. These stereoisomers may be used alone or as a mixture of these.

The organic compound may be used alone, or two or more kinds may be used in combination. The amount of the organic compound to add is preferably 0.001 to 50% by mass, and more preferably 0.01 to 30% by mass, relative to the entire solid content from which the solvent in the silicon-containing composition used in the first aspect is subtracted. The organic compound when added makes the film of the silicon-containing composition readily break during alkali development, leading to easy stripping.

For enhancing stability, the silicon-containing composition used in the first aspect may contain a monovalent, divalent, or higher-valent $C_{1-30}$ organic acid. Examples of the acid include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Among these, oxalic acid, maleic acid, formic acid, acetic acid, propionic acid, and citric acid, for example, are particularly preferable. For lasting stability, a mixture of two or more of these acids may be used. It is preferable to add the organic acid so that the pH of the composition satisfies the relationship of preferably 0≤pH≤7, more preferably 0.3≤pH≤6.5, and further preferably 0.5≤pH≤6. For example, the amount of the organic acid to add is preferably 0.01 to 30% by mass, and more preferably 0.1 to 15% by mass, relative to the entire solid content from which the solvent in the silicon-containing composition is subtracted.

The silicon-containing composition used in the first aspect may contain, as a stabilizer, a monovalent, divalent, or higher-valent alcohol containing a cyclic ether as a substituent or an ether compound. Specific examples of the stabilizer that may be contained include the stabilizers described in paragraphs (0180) to (0184) in Japanese Unexamined Patent Application, Publication No. 2009-126940.

The silicon-containing composition used in the first aspect may contain water. Water, when added, enhances lithography performance. The content of water in the solvent component of the silicon-containing composition is preferably higher than 0% by mass and lower than 50% by mass, more preferably 0.3 to 30% by mass, and further preferably 0.5 to 20% by mass.

The silicon-containing composition used in the first aspect may contain a photoacid generator. Specific examples of the photoacid generator that may be contained include the photoacid generators described in paragraphs (0160) to (0179) in Japanese Unexamined Patent Application, Publication No. 2009-126940.

The silicon-containing composition used in the first aspect may contain a surfactant as needed. Specific examples of the surfactant that may be contained include the surfactants described in paragraph (0185) in Japanese Unexamined Patent Application, Publication No. 2009-126940.

The silicon-containing composition used in the first aspect may contain a thermal-crosslinking promoter. Specific examples of the thermal-crosslinking promoter that may be contained include the thermal-crosslinking promoters described in Japanese Unexamined Patent Application, Publication No. 2007-302873. Examples of the thermal-crosslinking promoter include phosphate compounds, borate compounds, and other salt compounds. Examples of the phosphate compounds include ammonium salts such as ammonium phosphate, tetramethylammonium phosphate, and tetrabutylammonium phosphate and sulfonium salts such as triphenylsulfonium phosphate and mono(triphenylsulfonium) phosphate. Examples of the borate compounds include ammonium salts such as ammonium borate, tetramethylammonium borate, and tetrabutylammonium borate and sulfonium salts such as triphenylsulfonium borate and mono(triphenylsulfonium) borate. Examples of such other salt compounds include sulfonium salts such as mono(triphenylsulfonium) maleate, triphenylsulfonium nitrate, and tetramethylammonium nitrate. The thermal-crosslinking promoter may be used alone, or two or more kinds may be used in combination. The amount of the thermal-crosslinking promoter to add is preferably 0.01 to 50% by mass, and more preferably 0.1 to 40% by mass, relative to the entire solid content from which the solvent in the silicon-containing composition is subtracted. The composition according to the first aspect may further contain various curing agents. Examples of the curing agents include Brønsted acid; imidazoles; organic amines; organophosphorus compounds and complexes thereof; organic amine complexes of Lewis acid; amidines; and curing agents that generate a basic component in response to light or heat.

<Step 2>

In the step 2, the film of a resin composition is formed on the film of the silicon-containing composition. It is preferable that the film of a resin composition be formed by applying a resin composition to the film of the silicon-containing composition. The film of a resin composition may be either a colored film attributed to a colorant described below added to the resin composition or a non-colored film. The film of a resin composition may be either a radiation-sensitive (photosensitive) film or a radiation-nonsensitive film. The method of forming the film of a resin composition on the film of the silicon-containing composition is not particularly limited as long as the effects of the present invention are not impaired, and examples thereof include coating the resin composition with the use of a contact-transfer-type coating apparatus such as a roll coater, a reverse coater, or a bar coater or a non-contact-type coating apparatus such as a spinner (a spin coating apparatus) or a curtain flow coater.

After coating, it is preferable to dry (pre-bake) the resulting coating of the resin composition. The method of drying is not particularly limited, and examples of the method include (1) drying on a hot plate at a temperature of 60 to 150° C., preferably 80 to 120° C., and more preferably 90 to 100° C., for 60 to 120 seconds, (2) leaving the coating to itself at room temperature for several hours to several days, and (3) placing the coating in a warm-air heater or an infrared heater for several dozen minutes to several hours for removal of solvent. After drying, the resulting coating of the resin composition may or may not be subjected to exposure by irradiation of an active energy ray such as ultraviolet light or excimer laser light. The dose of the active energy ray is not particularly limited, but may be about 30 to about 2000 mJ/cm$^2$, for example. After drying or exposing, the resulting coating of the resin composition may be subjected to baking (post-baking). The baking temperature is further preferably 80° C. to 250° C., for example. The time for drying is preferably 10 seconds to 120 seconds, and more preferably 15 seconds to 60 seconds. The film thickness of the film of the resin composition is not particularly limited, and is 10 nm to 100000 nm, for example, preferably 50 nm to 5000 nm, more preferably 100 nm to 500 nm, and further preferably 100 nm to 300 nm.

(Resin Composition)

It is preferable that the resin composition contains, for example, a thermosetting resin that forms crosslinking in response to heat and then becomes converted into a polymer compound or receives chemical modification such as intramolecular cyclization in response to heat; or a photopolymerizable compound that may cure when subjected to exposure.

Examples of the thermosetting resin include precursor materials of various thermosetting resins that are widely used conventionally. Specific examples of the thermosetting resin include phenolic resins, epoxy resins, oxetane resins, melamine resins, urea resins, unsaturated polyester resins, alkyd resins, polyurethane resins, polyimide resins, polybenzoxazole resins, and polybenzimidazole resins.

In the case in which the resin composition contains the thermosetting resin, the resin composition may contain additives such as a curing agent, a curing accelerator, a dehydration condensation agent, an antioxidant, an ultraviolet absorber, a flame retardant, a mold release agent, a plasticizer, a filler, and a reinforcing agent and a reinforcing agent, as needed. For easy film formation, the resin composition may contain a solvent. The type of the solvent is selected as appropriate depending on the type of the thermosetting resin.

The resin composition may be either sensitive to radiation or insensitive to radiation, and may be a radiation-sensitive composition known as so-called photoresist composition. In the case in which the resin composition is a radiation-sensitive composition, the resin composition may contain, for example, various photocurable compounds, alkali-soluble resins, and resins with their alkali solubility enhanced when subjected to exposure. In the case in which the resin composition is a radiation-sensitive composition, the resin composition may be either a negative-type radiation-sensitive composition that becomes insoluble in a developing solution when subjected to exposure or a positive-type radiation-sensitive composition that becomes soluble in a developing solution when subjected to exposure. In the case in which the resin composition is a radiation-sensitive composition, it is preferable that the radiation-sensitive composition have any of the following aspects of radiation-sensitive compositions (1) to (3).

(Radiation-Sensitive Composition (1))

The radiation-sensitive composition (1) is a negative-type radiation-sensitive composition that contains an alkali-soluble resin (A1) and optionally contains a photopolymerizable compound (A2), a photopolymerization initiator (C), and an organic solvent.

The alkali-soluble resin (A1) in the radiation-sensitive composition (1) is not particularly limited and may be a conventionally known alkali-soluble resin. The alkali-soluble resin (A1) may contain an ethylenically unsaturated group or may contain no ethylenically unsaturated group. In the present specification, the alkali-soluble resin refers to a resin with the following properties: in the case in which a solution containing the resin in a concentration of 20% by mass (solvent, propylene glycol monomethyl ether acetate) is applied to a substrate to form a resin film with a film thickness of 1 μm, and the resulting resin film is immersed in a 2.38%-by-mass aqueous solution of tetramethylammonium hydroxide (TMAH) for 1 minute, 0.01 μm or more of the film is dissolved.

The alkali-soluble resin (A1) having an ethylenically unsaturated group may be obtained as follows, for example: an epoxy compound and an unsaturated carboxylic acid are subjected to reaction; and the resulting reaction product is further subjected to reaction with a polybasic acid anhydride.

Among these, a resin represented by the following formula (a-1) is preferable. A resin represented by the formula (a-1) is preferable because it is highly photocurable.

[Chem. 13]

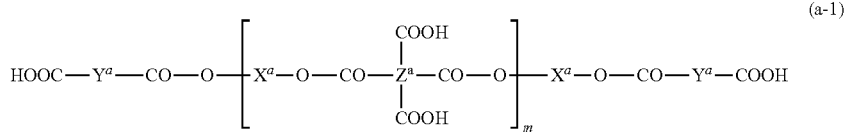
(a-1)

In the formula (a-1), $X^a$ represents a group represented by the following formula (a-2).

[Chem. 14]

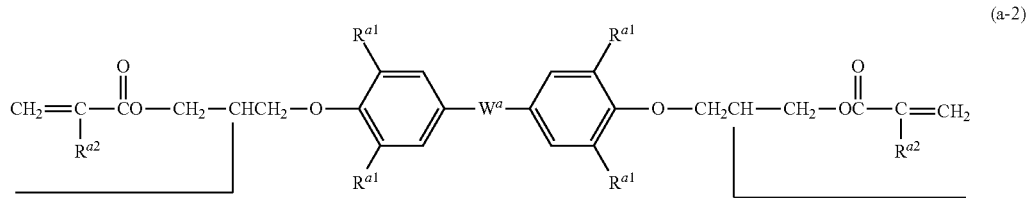
(a-2)

In the formula (a-2), $R^{a1}$ independently represents a hydrogen atom, a $C_{1-6}$ hydrocarbon group, or a halogen atom; $R^{a2}$ independently represents a hydrogen atom or a methyl group; and $W^a$ represents a single bond or a group represented by the following formula (a-3).

[Chem. 15]

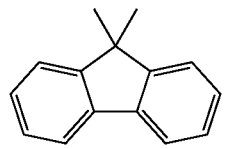
(a-3)

In the formula (a-1), $Y^a$ represents a residue that is a dicarboxylic anhydride from which an acid anhydride group (—CO—O—CO—) is removed. Examples of the dicarboxylic anhydride include maleic anhydride, succinic anhydride, itaconic anhydride, phthalic anhydride, tetrahydrophthalic anhydride, hexahydrophthalic anhydride, methylendomethylene tetrahydrophthalic anhydride, chlorendic anhydride, methyltetrahydrophthalic anhydride, and glutaric anhydride.

In the formula (a-1), $Z^a$ represents a residue that is a tetracarboxylic dianhydride from which two acid anhydride groups are removed. Examples of the tetracarboxylic dianhydride include pyromellitic dianhydride, benzophenone tetracarboxylic dianhydride, biphenyltetracarboxylic dianhydride, and biphenyl ether tetracarboxylic dianhydride. In the formula (a-1), m represents an integer of 0 to 20.

The alkali-soluble resin (A1) having an ethylenically unsaturated group may also be, for example, polyester (meth)acrylate that is obtained by subjecting a polyhydric alcohol and a monobasic acid or a polybasic acid to condensation and then subjecting the resulting polyester prepolymer to reaction with (meth)acrylic acid; polyurethane (meth)acrylate that is obtained by subjecting a polyol and a compound having two isocyanate groups to reaction and then subjecting the resultant to reaction with (meth)acrylic acid; and an epoxy (meth)acrylate resin that is obtained by reaction of an epoxy resin such as a bisphenol A epoxy resin, a bisphenol F epoxy resin, a bisphenol S epoxy resin, a phenol or cresol novolac epoxy resin, a resole epoxy resin, a triphenol methane epoxy resin, a polycarboxylic acid polyglycidyl ester, a polyol polyglycidyl ester, an aliphatic or alicyclic epoxy resin, an amine epoxy resin, or a dihydroxybenzene epoxy resin with (meth)acrylic acid. In the present specification, "(meth)acrylic acid" refers to either acrylic acid or methacrylic acid. Similarly, "(meth)acrylate" refers to either an acrylate or a methacrylate.

The alkali-soluble resin (A1) having no ethylenically unsaturated group may be obtained by copolymerizing an unsaturated carboxylic acid with another unsaturated compound. That another unsaturated compound is preferably at least one selected from epoxy-group-containing unsaturated compounds and alicyclic-group-containing unsaturated compounds.

Examples of the unsaturated carboxylic acid include monocarboxylic acids such as (meth)acrylic acid and crotonic acid; dicarboxylic acids such as maleic acid, fumaric acid, citraconic acid, mesaconic acid, and itaconic acid; and anhydrides of these dicarboxylic acids. Among these, from the viewpoints of copolymerization reactivity, alkali solubility of the resulting resin, availability, and the like, (meth)acrylic acid and maleic anhydride are preferable. The unsaturated carboxylic acid may be used alone, or two or more kinds may be used in combination.

Examples of the epoxy-group-containing unsaturated compounds include epoxy-group-containing unsaturated compounds having no alicyclic group and epoxy-group-containing unsaturated compounds having an alicyclic group. Examples of the epoxy-group-containing unsaturated compounds having no alicyclic group include epoxyalkyl (meth)acrylates such as glycidyl (meth)acrylate, 2-methylglycidyl (meth)acrylate, 3,4-epoxybutyl (meth)acrylate, and 6,7-epoxyheptyl (meth)acrylate; epoxyalkyloxyalkyl (meth)acrylates such as 2-glycidyloxyethyl (meth)acrylate, 3-glycidyloxy-n-propyl (meth)acrylate, 4-glycidyloxy-n-butyl (meth)acrylate, 5-glycidyloxy-n-hexyl (meth)acrylate, and 6-glycidyloxy-n-hexyl (meth)acrylate; α-alkyl acrylic acid epoxyalkyl esters such as α-ethylacrylic acid glycidyl ester, α-n-propylacrylic acid glycidyl ester, α-n-butylacrylic acid glycidyl ester, and α-ethylacrylic acid 6,7-epoxyheptyl ester; and glycidyl ethers such as o-vinylbenzyl glycidyl ether, m-vinylbenzyl glycidyl ether, and p-vinylbenzyl glycidyl ether. Among these, from the viewpoints of copolymerization reactivity and strength of the resulting cured resin, for example, glycidyl (meth)acrylate, 2-methylglycidyl (meth)acrylate, 6,7-epoxyheptyl (meth)acrylate, o-vinylbenzyl glycidyl ether, m-vinylbenzyl glycidyl ether, and p-vinylbenzyl glycidyl ether are preferable. These epoxy-group-containing unsaturated compounds may be used alone, or two or more kinds may be used in combination.

The alicyclic-group-containing unsaturated compounds are not particularly limited as long as they are unsaturated compounds having an alicyclic group. The alicyclic group may be either a monocyclic alicyclic group or a polycyclic alicyclic group. Examples of the monocyclic alicyclic group include a cyclopentyl group and a cyclohexyl group. Examples of the polycyclic alicyclic group include an adamantyl group, a norbornyl group, an isobornyl group, a tricyclononyl group, a tricyclodecyl group, and a tetracyclododecyl group.

It is preferable that the unsaturated carboxylic acid be polymerized with a yet another compound. Examples of that yet another compound include (meth)acrylic acid esters, (meth)acrylamides, allyl compounds, vinyl ethers, vinyl esters, styrenes, and maleimides. These compounds may be used alone, or two or more kinds may be used in combination.

It may be also suitable to use the following as the alkali-soluble resin (A1): a copolymer that includes at least a structural unit derived from an unsaturated carboxylic acid and a structural unit containing a moiety polymerizable with the photopolymerizable compound (A2) described below; or a copolymer that includes at least a structural unit derived from an unsaturated carboxylic acid, a structural unit derived from an epoxy-group-containing unsaturated compound, and a structural unit containing a moiety polymerizable with the photopolymerizable compound (A2) described below.

The copolymer that includes a structural unit containing a moiety polymerizable with the photopolymerizable compound (A2) may further include one or more structural units derived from the (meth)acrylic acid esters, the (meth)acrylamides, the allyl compounds, the vinyl ethers, the vinyl esters, the styrenes, and the maleimides, and the like mentioned above.

The structural unit containing a moiety polymerizable with the photopolymerizable compound (A2) preferably has an ethylenically unsaturated group as the moiety polymerizable with the photopolymerizable compound (A2). The copolymer including this structural unit may be prepared by subjecting at least some carboxy groups in an unsaturated carboxylic acid homopolymer to reaction with an epoxy-group-containing unsaturated compound. The copolymer that includes a structural unit containing a moiety polymerizable with the photopolymerizable compound (A2) may also be prepared by subjecting at least some epoxy groups in a copolymer that includes a structural unit derived from an unsaturated carboxylic acid and a structural unit derived from an epoxy-group-containing unsaturated compound to reaction with an unsaturated carboxylic acid.

The proportion of the structural unit derived from an unsaturated carboxylic acid in the alkali-soluble resin (A1) is preferably 3 to 25% by mass, and more preferably 5 to 25% by mass. The proportion of the structural unit derived from an epoxy-group-containing unsaturated compound is preferably 30 to 95% by mass, and more preferably 50 to 90% by mass. The proportion of the structural unit derived from an alicyclic-group-containing unsaturated compound is preferably 1 to 30% by mass, more preferably 3 to 25% by mass, and further preferably 5 to 20% by mass. In the case in which the proportions are within the above respective ranges, the resulting resin may have an appropriate level of alkali solubility, the radiation-sensitive composition may have enhanced adhesion to the substrate, and the radiation-sensitive composition after curing may have enhanced strength.

The mass average molecular weight of the alkali-soluble resin (A1) is preferably 1000 to 40000, and more preferably 2000 to 30000. In the case in which the mass average molecular weight is within the range described above, excellent development, sufficient heat resistance, and sufficient film strength may be obtained.

The content of the alkali-soluble resin (A1) is preferably 5 to 80% by mass, and more preferably 15 to 50% by mass, relative to the solid content of the radiation-sensitive composition of the first aspect. In the case in which the content is within the range described above, development tends to proceed in a good balance.

The photopolymerizable compound (A2) in the radiation-sensitive composition of the first aspect is either a monofunctional monomer or a polyfunctional monomer. Examples of the monofunctional monomer include (meth)acrylamide, methylol (meth)acrylamide, methoxymethyl (meth)acrylamide, ethoxymethyl (meth)acrylamide, propoxymethyl (meth)acrylamide, butoxymethoxymethyl (meth)acrylamide, N-methylol (meth)acrylamide, N-hydroxymethyl (meth)acrylamide, (meth)acrylic acid, fumaric acid, maleic acid, maleic anhydride, itaconic acid, itaconic anhydride, citraconic acid, citraconic anhydride, crotonic acid, 2-acrylamide-2-methylpropanesulfonic acid, tert-butyl acrylamide sulfonic acid, methyl (meth)acrylate, ethyl (meth)acrylate, butyl (meth)acrylate, 2-ethylhexyl (meth)acrylate, cyclohexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, glycerol mono(meth)acrylate, tetrahydrofurfuryl (meth)acrylate, dimethylamino (meth)acrylate, glycidyl (meth)acrylate, 2,2,2-trifluoroethyl (meth)acrylate, 2,2,3,3-tetrafluoropropyl (meth)acrylate, and half (meth)acrylates of phthalic acid derivatives. The monofunctional monomer may be used alone, or two or more kinds may be used in combination.

Examples of the polyfunctional monomer include polyfunctional monomers such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerol di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, glycerol triacrylate, glycerol polyglycidyl ether poly(meth)acrylate, urethane (meth)acrylate (in other words, tolylene diisocyanate), a reaction product of trimethylhexamethylene diisocyanate, hexamethylene diisocyanate, and 2-hydroxyethyl (meth)acrylate, methylenebis(meth)acrylamide, (meth)acrylamide methylene ether, condensates of a polyhydric alcohol and N-methylol (meth)acrylamide, and triacrylformal. The polyfunctional monomer may be used alone, or two or more kinds may be used in combination.

The content of the photopolymerizable compound (A2) is preferably 1 to 30% by mass, and more preferably 5 to 20% by mass, relative to the solid content of the radiation-sensitive composition (1). In the case in which the content is within the range described above, a good balance between sensitivity, development, and resolution tends to be obtained.

The photopolymerization initiator (C) in the radiation-sensitive composition (1) is not particularly limited and may be a conventionally known photopolymerization initiator.

Specific examples of the photopolymerization initiator (C) include 1-hydroxycyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl) ketone, 2-methyl-1-[4-(methylthio)phenyl]-2-morpholinopropan-1-one, 2-benzyl-2-dimethylamino-1-(4-morpholinophenyl)-butan-1-one, ethanone, 1-[9-ethyl-6-(2-methylbenzoyl)-9H-carbazol-3-yl], 1-(O-acetyloxime), (9-ethyl-6-nitro-9H-carbazol-3-yl)[4-(2-methoxy-1-methylethoxy)-2-methylphenyl]methanone O-acetyloxime, 2-(benzoyloxyimino)-1-[4-(phenylthio)phenyl]-1-octanone, 2,4,6-trimethylbenzoyldiphenylphosphine oxide, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethyl acetal, benzyl dimethyl ketal, 1-phenyl-1,2-propanedione-2-(O-ethoxycarbonyl) oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene hydroperoxide, 2-mercaptobenzimidazole, 2-mercaptobenzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl-4-dimethylamino benzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, and 2,4-bis-trichloromethyl-6-(2-bromo-4-methoxy)styrylphenyl-s-triazine. The photopolymerization initiator may be used alone, or two or more kinds may be used in combination.

Among these, an oxime-type photopolymerization initiator is particularly preferable from the viewpoint of sensitivity. Particularly preferable examples of the oxime-type photopolymerization initiator include O-acetyl-1-[6-(2-methylbenzoyl)-9-ethyl-9H-carbazol-3-yl]ethanone oxime, ethanone, 1-[9-ethyl-6-(pyrrol-2-ylcarbonyl)-9H-carbazol-3-yl], 1-(O-acetyloxime), and 1,2-octanedione, 1-[4-(phenylthio)-, 2-(O-benzoyloxime)].

The content of the photopolymerization initiator is preferably 0.5 to 20 parts by mass relative to 100 parts by mass of the solid content of the radiation-sensitive composition (1). In the case in which the content is within the range described above, sufficient heat resistance, sufficient chemical resistance, enhanced coating formation, and inhibited curing defects may be obtained.

The radiation-sensitive composition (1) may further contain a colorant. With a colorant contained, the radiation-sensitive composition may be preferably used for, for example, forming color filters of image displays such as liquid crystal displays and organic EL displays. In the case in which the colorant is a light-blocking agent, the radiation-sensitive composition (1) may be preferably used for, for example, forming black matrices of color filters.

The colorant is not particularly limited. For example, compounds categorized as Pigments according to Color Index (C. I. issued by The Society of Dyers and Colourists) are preferable and, more specifically, compounds with the following color index (C. I.) numbers are preferable.

C. I. Pigment Yellow 1 (the same "C. I. Pigment Yellow" applies to the rest and therefore respective numbers alone are listed below), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, and 185;

C. I. Pigment Orange 1 (the same "C. I. Pigment Orange" applies to the rest and therefore respective numbers alone are listed below), 5, 13, 14, 16, 17, 24, 34, 36, 38, 40, 43, 46, 49, 51, 55, 59, 61, 63, 64, 71, and 73;

C. I. Pigment Violet 1 (the same "C. I. Pigment Violet" applies to the rest and therefore respective numbers alone are listed below), 19, 23, 29, 30, 32, 36, 37, 38, 39, 40, and 50;

C. I. Pigment Red 1 (the same "C. I. Pigment Red" applies to the rest and therefore respective numbers alone are listed below), 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, and 265;

C. I. Pigment Blue 1 (the same "C. I. Pigment Blue" applies to the rest and therefore respective numbers alone are listed below), 2, 15, 15:3, 15:4, 15:6, 16, 22, 60, 64, and 66;
C. I. Pigment Green 7, C. I. Pigment Green 36, and C. I. Pigment Green 37;
C. I. Pigment Brown 23, C. I. Pigment Brown 25, C. I. Pigment Brown 26, and C. I. Pigment Brown 28; and
C. I. Pigment Black 1 and C. I. Pigment Black 7.

In the case in which the colorant is a light-blocking agent, the light-blocking agent is preferably a black pigment. The black pigment may be any of various organic and inorganic pigments. Examples thereof include carbon black; black titanium oxide; and metal oxides, complex oxides, metal sulfides, metal sulfates, and metal carbonates of metals such as copper, iron, manganese, cobalt, chromium, nickel, zinc, calcium, and silver. Among these, carbon black is preferable because of its excellent light-blocking capability.

The carbon black that may be used is a known carbon black such as channel black, furnace black, thermal black, or lamp black. Channel black is preferable because it has excellent light-blocking capability. A resin-coated carbon black may also be used.

A resin-coated carbon black has low conductivity compared to carbon black with no resin coating. Therefore, when used as a black matrix of a liquid crystal display, a resin-coated carbon black allows only a small amount of leak current and thereby renders the resulting display highly reliable and low in power consumption.

For adjusting the tone of color of the carbon black, the organic pigment may be added as appropriate as an auxiliary pigment.

For uniform dispersion of the colorant in the radiation-sensitive composition, a dispersant may be additionally used. The dispersant is preferably a polyethyleneimine-type polymer dispersant, a urethane-resin-type polymer dispersant, or an acrylic-resin-type polymer dispersant. In the case in which carbon black is used as the colorant, an acrylic-resin-type dispersant is preferably used as the dispersant.

The inorganic pigment and the organic pigment may be used alone or as a combination. Particularly in the case in which the inorganic pigment and the organic pigment are used in combination, the content of the organic pigment is preferably in the range of 10 to 80 parts by mass, and more preferably in the range of 20 to 40 parts by mass, relative to 100 parts by mass of the total content of the inorganic pigment and the organic pigment.

The content of the colorant may be determined as appropriate depending on the applications of the radiation-sensitive composition (1). For example, the content of the colorant is preferably 5 to 70 parts by mass, and more preferably 25 to 60 parts by mass, relative to 100 parts by mass of the solid content of the radiation-sensitive composition (1). Particularly in the case in which the radiation-sensitive composition (1) is used to form a black matrix, it is preferable to adjust the amount of the light-blocking agent in the radiation-sensitive composition so that the OD value is 4 or more per 1 µm of the film thickness of the black matrix. In the case in which the OD value is 4 or more per 1 µm of the film thickness of the black matrix, the resulting liquid crystal display containing the black matrix may have sufficient contrast on the screen.

It is preferable that the colorant added to the radiation-sensitive composition be in a form of dispersion with an appropriate concentration prepared with the use of a dispersant.

Examples of the organic solvent in the radiation-sensitive composition (1) include (poly)alkylene glycol monoalkyl ethers such as ethylene glycol monomethyl ether, ethylene glycol monoethyl ether, ethylene glycol n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; lactic acid alkyl esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; amides such as N-methylpyrrolidone, N,N-dimethylformamide, and N,N-dimethylacetamide; and the solvents for the silicon-containing composition used in the first aspect. The organic solvent may be used alone, or two or more kinds may be used in combination.

Among these organic solvents, amides such as propylene glycol monomethyl ether, ethylene glycol monomethyl ether acetate, propylene glycol monomethyl ether acetate, propylene glycol monoethyl ether acetate, diethylene glycol dimethyl ether, diethylene glycol methylethyl ether, cyclohexanone, 3-methoxybutyl acetate, N-methylpyrrolidone, N,N-dimethylformamide, and N,N-dimethylacetamide and the solvents suitable for the silicon-containing composition used in the first aspect are preferable because these organic solvents dissolve well in the alkali-soluble resin (A1), the photopolymerizable compound (A2), and the photopolymerization initiator (C).

The content of the organic solvent is preferably determined so that the solid content of the radiation-sensitive composition (1) is 1 to 50% by mass, and more preferably 5 to 30% by mass.

The radiation-sensitive composition (1) may contain various additives as needed. Examples of the additives include a sensitizer, a curing accelerator, a filler, an adhesion promoter, an antioxidant, an ultraviolet absorber, an anti-aggregation agent, a thermal polymerization inhibitor, a defoaming agent, and a surfactant. An optional additive may also be used, such as benzotriazole derivatives such as 1-(N,N-di (2-ethylhexyl)amino)methyl-1H-benzotriazole, 1-(N,N-di (2-ethylhexyl)amino)methyl-1H-methylbenzotriazole, carboxybenzotriazole, benzotriazole, methylbenzotriazole, dihydroxypropylbenzotriazole, and bisaminomethylbenzotriazole. The optional additive may be used alone, or two or more kinds may be used in combination. The amount of the various additives to add may be determined as appropriate within the range of 0.001% by mass to 10% by mass, for example, preferably 0.1 to 5% by mass, relative to the amount of the entire composition.

(Radiation-Sensitive Composition (2))

The radiation-sensitive composition (2) is a positive-type radiation-sensitive composition. In the case in which the radiation-sensitive composition (2) is a chemically-amplified positive-type radiation-sensitive composition, the radiation-sensitive composition further contains an acid generator (hereinafter, also called photoacid generator), which is capable of producing an acid when irradiated with an active ray or radiation, and a resin (hereinafter, also called photosensitive resin), which becomes more soluble in alkali in response to the action of acid. The radiation-sensitive composition (2) may further contain a component such as an alkali-soluble resin, an acid-diffusion inhibitor, and an organic solvent, as needed. Examples of other types of radiation-sensitive composition (2) include a positive-type radiation-sensitive composition that contains a compound having a quinone diazide group and an alkali-soluble resin such as a novolac phenol resin (such as a novolac resin (C1) described below). The positive-type radiation-sensitive composition described in Japanese Unexamined Patent Application, Publication No. 2015-194719 may also be used.

The photoacid generator is a compound capable of producing an acid when irradiated with an active ray or radiation, and is not particularly limited as long as it is a compound which directly or indirectly produces an acid under the action of light. The photoacid generator Hereinafter, suitable but non-limiting examples among the photoacid generators that are suitably used in the radiation-sensitive composition (2) will be described.

A first group of examples of suitable photoacid generators may be a compound represented by the following formula (a1).

[Chem. 16]

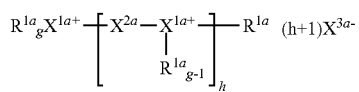
(a1)

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and * represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$. $R^{2a}$ represents an alkyl group having 1 to 5 carbon atoms, or an aryl group having 6 to 10 carbon atoms.

$X^{2a}$ represents a structure represented by the following formula (a2).

[Chem. 17]

(a2)

In the formula (a2), $X^{4a}$ represents an alkylene group having 1 to 8 carbon atoms, an arylene group having 6 to 20 carbon atoms, or a divalent group of a heterocyclic compound having 8 to 20 carbon atoms, and $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

[Chem. 18]

(a17)

In the formula (a17), $R^{3a}$ represents an alkyl group having 80% or more of the hydrogen atoms substituted by fluorine atoms. j represents the number of $R^{3a}$s and is an integer from 1 to 5. $R^{3a}$s in the number of j may be respectively identical to or different from each other.

[Chem. 19]

(a18)

In the formula (a18) $R^{4a}$ to $R^{7a}$ each independently represents a fluorine atom or a phenyl group, and a part or all of the hydrogen atoms of the phenyl group may be substituted by at least one selected from the group consisting of a fluorine atom and a trifluoromethyl group.

Examples of the onium ion in the compound represented by the formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl} sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by the formula (a1), a preferred onium ion may be a sulfonium ion represented by the following formula (a19).

[Chem. 20]

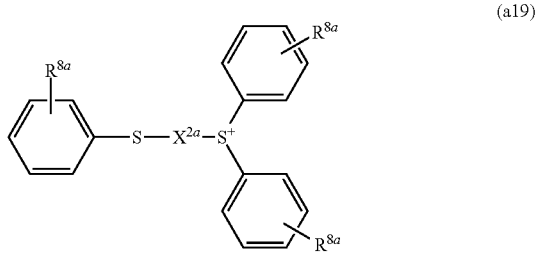

In the formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the formula (a1).

Specific examples of the sulfonium ion represented by the formula (a19) include 4-(phenylthio)phenyldiphenylsulfonium, 4-(4-benzoyl-2-chlorophenylthio)phenylbis (4-fluorophenyl) sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the formula (a17), $R^{3a}$ represents an alkyl group substituted with a fluorine atom, and a preferred number of carbon atoms is 1 to 8, while a more preferred number of carbon atoms is 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted by fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the formula (a1) decreases.

A particularly preferred example of $R^{3a}$ is a linear or branched perfluoroalkyl group having 1 to 4 carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{3a}$s represents an integer from 1 to 5, and is preferably 2 to 4, and particularly preferably 2 or 3.

Preferred specific examples of the borate anion represented by the formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

A second group of examples of suitable photoacid generators includes halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

[Chem. 21]

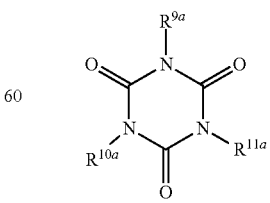

In the formula (a3), $R^{9a}$, $R^{10a}$ and $R^{11a}$ each independently represent a halogenated alkyl group.

A third group of examples of suitable photoacid generators includes α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

[Chem. 22]

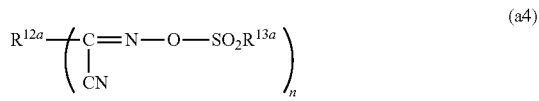

(a4)

In the formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that $R^{13a}$ is an alkyl group having 1 to 6 carbon atoms such as a methyl group, an ethyl group, a propyl group, and a butyl group. In particular, compounds in which $R^{12a}$ represents an aromatic compound group, and $R^{13a}$ represents an alkyl group having 1 to 4 carbon atoms are preferred.

A forth group of examples of suitable photoacid generators includes onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, a linear or branched alkoxy group having 1 to 6 carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 to 3.

Preferably, the cation moiety of the onium salt having a naphthalene ring at the cation moiety is of the structure represented by the following formula (a5).

[Chem. 23]

(a5)

In the formula (a5), at least one of $R^{14a}$, $R^{15a}$ and $R^{16a}$ represents a group represented by the following formula (a6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$ and $R^{16a}$ is a group represented by the following formula (a6), and the remaining two are each independently a linear or branched alkylene group having 1 to 6 carbon atoms, and these terminals may bond to form a ring structure.

[Chem. 24]

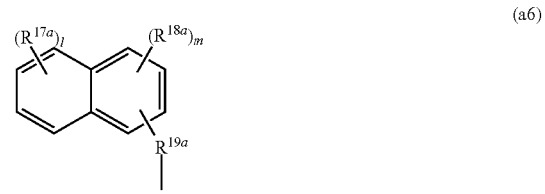

(a6)

In the formula (a6), $R^{17a}$ and $R^{10a}$ each independently represent a hydroxyl group, a linear or branched alkoxy group having 1 to 6 carbon atoms, or a linear or branched alkyl group having 1 to 6 carbon atoms, and $R^{19a}$ represents a single bond or a linear or branched alkylene group having 1 to 6 carbon atoms that may have a substituent. l and m each independently represent an integer of 0 to 2, and l+m is no greater than 3. In this regard, when there exist a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the formula (a6) is one in view of the stability of the compound, and the remaining are linear or branched alkylene groups having 1 to 6 carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy group having 1 to 6 carbon atoms, a linear or branched alkyl group having 1 to 6 carbon atoms, or the like.

Examples of suitable cation moiety include those represented by the following formulae (a7) and (a8), and the structure represented by the following formula (a8) is particularly preferable.

[Chem. 25]

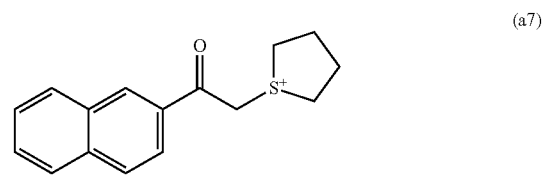

(a7)

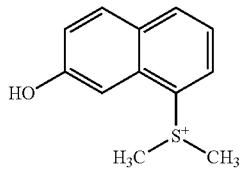

(a8)

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the photoacid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 to 20 carbon atoms. Preferably, the carbon number is 1 to 10 in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 to 20 carbon atoms, and is exemplified by a phenol group or a naphthyl group that may be unsubstituted or substituted with an alkyl group or a halogen atom. In particular, aryl groups having 6 to 10 carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

A sixth group of examples of suitable photoacid generators includes bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl) diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

Examples of other photoacid generators include bissulfonyldiazomethanes such as bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane, and bis(4-tert-butylphenylsulfonyl)diazomethane; sulfonylcarbonyl alkanes such as 2-methyl-2-(p-toluenesulfonyl)propiophenone, 2-(cyclohexylcarbonyl)-2-(p-toluenesulfonyl)propane, 2-methanesulfonyl-2-methyl-(p-methylthio)propiophenone, and 2,4-dimethyl-2-(p-toluenesulfonyl)pentan-3-one; sulfonylcarbonyldiazomethanes such as 1-p-toluenesulfonyl-1-cyclohexylcarbonyldiazomethane, 1-diazo-1-methylsulfonyl-4-phenyl-2-butanone, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl) acetate, tert-butyl 2-diazo-2-benzenesulfonyl acetate, isopropyl 2-diazo-2-methanesulfonyl acetate, cyclohexyl 2-diazo-2-benzenesulfonyl acetate, and tert-butyl 2-diazo-2-(p-toluenesulfonyl) acetate; nitrobenzyl derivatives such as 2-nitrobenzyl p-toluenesulfonate, 2,6-dinitrobenzyl p-toluenesulfonate, and 2,4-dinitrobenzyl p-trifluoromethyl benzenesulfonate; and esters of a polyhydroxy compound and an aliphatic or aromatic sulfonic acid, such as pyrogallol methanesulfonic acid ester, pyrogallol benzenesulfonic acid ester, pyrogallol p-toluenesulfonic acid ester, pyrogallol p-methoxybenzenesulfonic acid ester, pyrogallol mesitylenesulfonic acid ester, pyrogallol benzylsulfonic acid ester, alkyl gallate methanesulfonic acid esters, alkyl gallate benzenesulfonic acid esters, alkyl gallate p-toluenesulfonic acid esters, alkyl gallate (the alkyl group has 1 to 15 carbon atoms) p-methoxybenzenesulfonic acid esters, alkyl gallate mesitylenesulfonic acid esters, and alkyl gallate benzylsulfonic acid esters. These photoacid generators may be used alone, or two or more kinds may be used in combination.

This photoacid generator may be used alone, or two or more kinds may be used in combination. Furthermore, the content of the photoacid generator is preferably adjusted to 0.1% to 10% by mass, and more preferably 0.5% to 3% by mass, relative to the total mass of the radiation-sensitive composition (2). When the amount of the photoacid generator used is adjusted to the range described above, a radiation-sensitive composition (2) that is a uniform solution having satisfactory sensitivity and exhibiting excellent storage stability can be readily prepared.

The resin whose alkali solubility increases by the action of an acid is not particularly limited, and an arbitrary resin whose alkali solubility increases by the action of an acid may be used. Of these, at least one resin selected from the group consisting of a novolac resin (B1), a polyhydroxystyrene resin (B2), and an acrylic resin (B3) is preferably contained.

[Novolac Resin (B1)]

As the novolac resin (B1), a resin including the structural unit represented by the following formula (b1) may be used.

[Chem. 26]

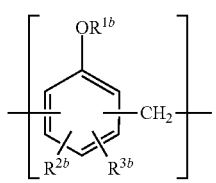

(b1)

In the formula (b1), $R^{1b}$ represents an acid-dissociable dissolution-inhibiting group, and $R^{2b}$ and $R^{3b}$ each independently represent a hydrogen atom or an alkyl group having 1 to 6 carbon atoms.

The acid-dissociable dissolution-inhibiting group represented by the above $R^{1b}$ is preferably a group represented by the following formula (b2) or (b3), a linear, branched or cyclic alkyl group having 1 to 6 carbon atoms, a vinyloxyethyl group, a tetrahydropyranyl group, a tetrafuranyl group, or a trialkylsilyl group.

[Chem. 27]

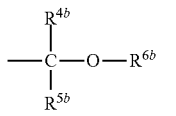

(b2)

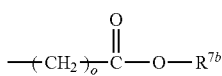

(b3)

In the formulae (b2) and (b3), $R^{4b}$ and $R^{5b}$ each independently represent a hydrogen atom, or a linear or branched alkyl group having 1 to 6 carbon atoms, $R^{6b}$ represents a linear, branched or cyclic alkyl group having 1 to 10 carbon atoms, $R^{7b}$ represents a linear, branched or cyclic alkyl group having 1 to 6 carbon atoms, and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociable dissolution-inhibiting group represented by the formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methylethyl group, 1-ethoxy-1-methylethyl group, and the like. Furthermore, specific examples of the acid-dissociable dissolution-inhibiting group represented by the formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

[Polyhydroxystyrene Resin (B2)]

As the polyhydroxystyrene resin (B2), a resin including the structural unit represented by the following formula (b4) may be used.

[Chem. 28]

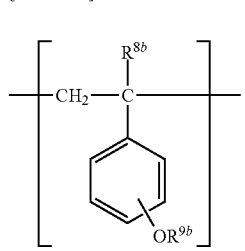

(b4)

In the formula (b4), $R^{8b}$ represents a hydrogen atom or an alkyl group having 1 to 6 carbon atoms, and $R^{9b}$ represents an acid-dissociable dissolution-inhibiting group.

The alkyl group having 1 to 6 carbon atoms may include, for example, linear, branched or cyclic alkyl groups having 1 to 6 carbon atoms. Examples of the linear or branched alkyl group include a methyl group, ethyl group, propyl group, isopropyl group, n-butyl group, isobutyl group, tert-butyl group, pentyl group, isopentyl group and neopentyl group, and examples of the cyclic alkyl group include a cyclopentyl group and cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic Resin (B3)]

As the acrylic resin (B3), a resin including a structural unit represented by the following formulae (b5) to (b7) may be used.

[Chem. 29]

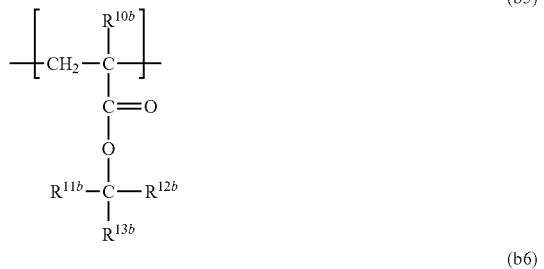
(b5)

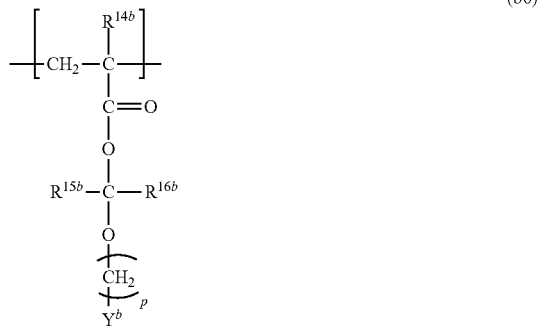
(b6)

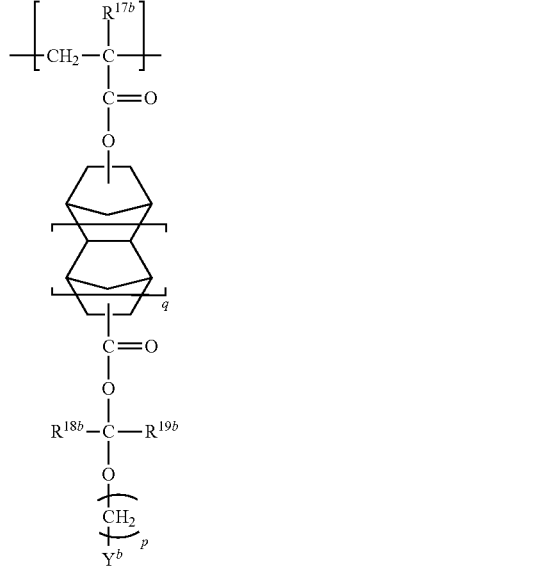
(b7)

$R^{10b}$ and $R^{14b}$ to $R^{19b}$ in the above formulae (b5) to (b7) are each independently a hydrogen atom, a linear or branched alkyl group having 1 to 6 carbon atoms, a fluorine atom or a linear or branched fluorinated alkyl group having 1 to 6 carbon atoms. $R^{11b}$ to $R^{13b}$ are each independently a linear or branched alkyl group having 1 to 6 carbon atoms, a linear or branched fluorinated alkyl group having 1 to 6 carbon atoms or an aliphatic cyclic group having 5 to 20 carbon atoms. $R^{12b}$ and $R^{13b}$ may join each other to form a hydrocarbon ring having 5 to 20 carbon atoms together with a carbon atom to which the both are attached. $Y^b$ represents an aliphatic cyclic group or an alkyl group optionally having a substituent. p is an integer of 0 to 4, and q is 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms. Specific examples of the aliphatic cyclic group include a group in which one or more hydrogen atoms are removed from monocycloalkanes and polycycloalkanes such as bicycloalkanes, tricycloalkanes and tetracycloalkanes. Specific examples thereof include a group in which one hydrogen atom is removed from monocycloalkanes such as cyclopentane, cyclohexane, cycloheptane and cyclooctane, and polycycloalkanes such as adamantane, norbornane, isobornane, tricyclodecane and tetracyclododecane. In particular, cyclohexane and adamantane from which one hydrogen atom is removed (optionally further having a substituent) are preferable.

In a case where the above $R^{12b}$ and $R^{13b}$ do not form hydrocarbon ring by joining each other, a linear or branched alkyl group having 2 to 4 carbon atoms is preferred as the above $R^{11b}$, $R^{12b}$ and $R^{13b}$ in view of high contrast, good resolution, good focal depth-width and the like. As the above $R^{15b}$, $R^{16b}$, $R^{18b}$ and $R^{19b}$, preferred is a hydrogen atom or a methyl group.

The above $R^{12b}$ and $R^{13b}$ may form an aliphatic cyclic group having 5 to 20 carbon atoms together with a carbon atom to which the both are attached. Specific examples of such an aliphatic cyclic group include a group in which one or more hydrogen atoms are removed from monocycloalkanes; and polycycloalkanes such as bicycloalkane, tricycloalkane and tetracycloalkane. Specifically, they include a group in which one or more hydrogen atoms are removed from monocycloalkanes such as cyclopentane, cyclohexane and cycloheptane; and polycycloalkanes such as adamantane, norbornane, isobornane, tricyclodecane and tetracyclododecane; and the like. In particular, preferred is a group (optionally further having a substituent) in which one or more hydrogen atoms are removed from cyclohexane and adamantane.

Further, in a case where an aliphatic cyclic group to be formed with the above $R^{12b}$ and $R^{13b}$ has a substituent on the ring backbone thereof, examples of the above substituent include a polar group such as a hydroxyl group, a carboxyl group, a cyano group and an oxygen atom (=O), and a linear or branched alkyl group having 1 to 4 carbon atoms. As the polar group, an oxygen atom (=O) is particularly preferred.

The aforementioned $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $Y^b$ has a substituent on the ring backbone, the substituent is exemplified by polar groups such as a hydroxide group, carboxyl group, cyano group and oxygen atom (=O), and linear or branched lower alkyl groups having 1 to 4 carbon atoms. The polar group is preferably an oxygen atom (=O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-iso-propoxyethyl group, 1-n-butoxyethyl group, 1-isobutoxy-ethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

[Chem. 30]

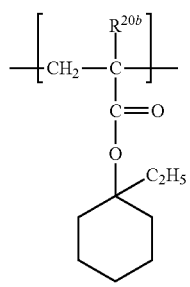

(b5-1)

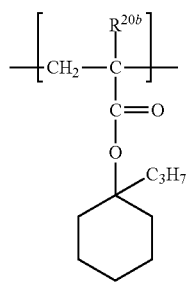

(b5-2)

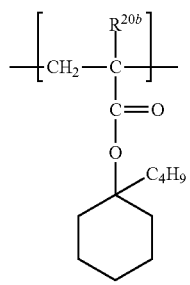

(b5-3)

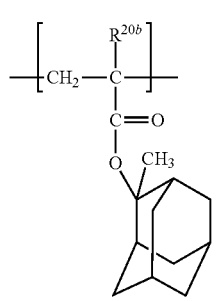

(b5-4)

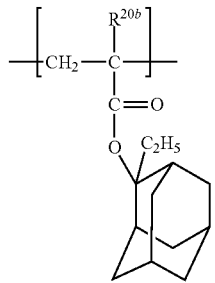

(b5-5)

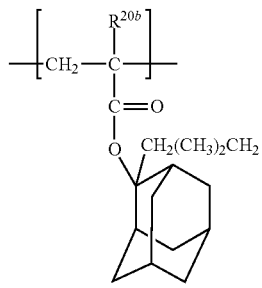

(b5-6)

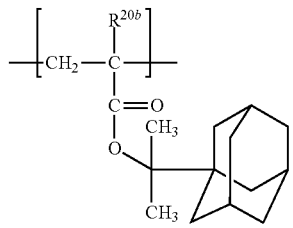

(b5-7)

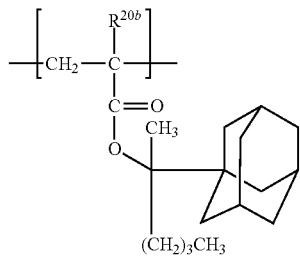

(b5-8)

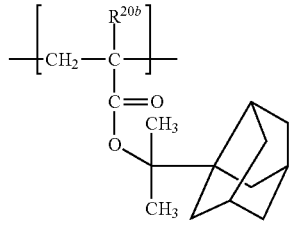

(b5-9)

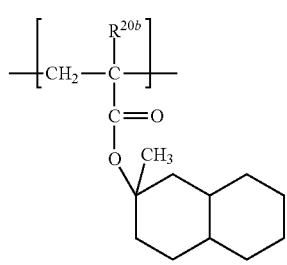

(b5-10)

(b5-11) 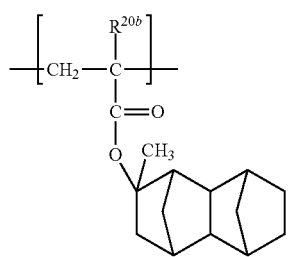
(b5-12) 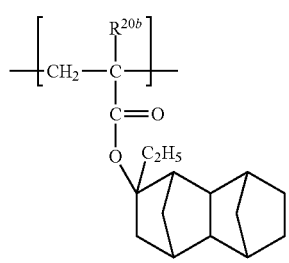
(b5-13) 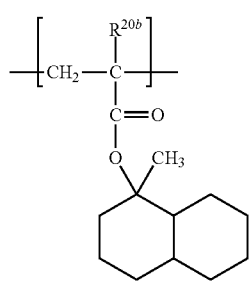
(b5-14) 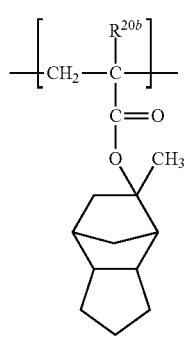
(b5-15) 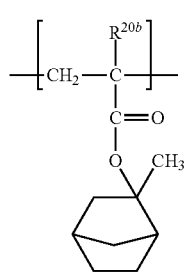
(b5-16) 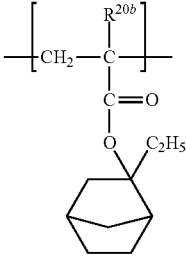
(b5-17) 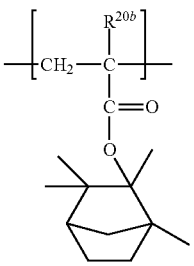
(b5-18) 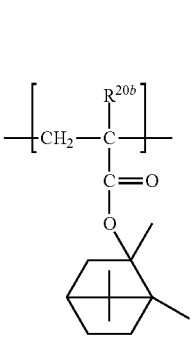
(b5-19) 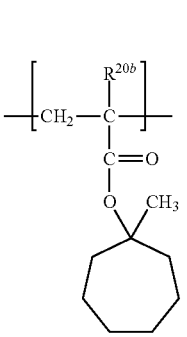
(b5-20) 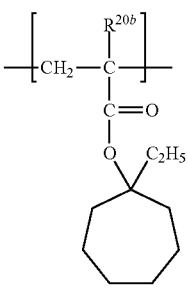

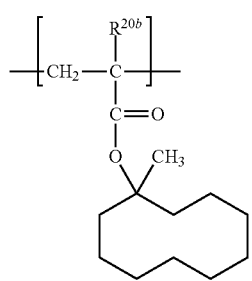 (b5-21)
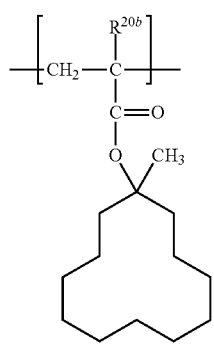 (b5-22)
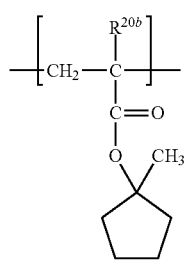 (b5-23)
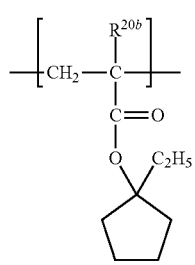 (b5-24)
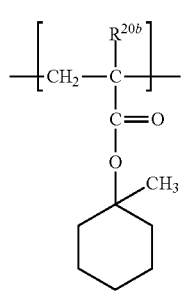 (b5-25)
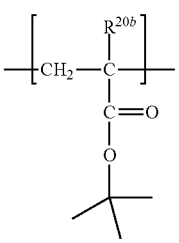 (b5-26)
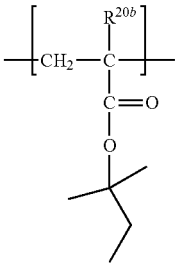 (b5-27)
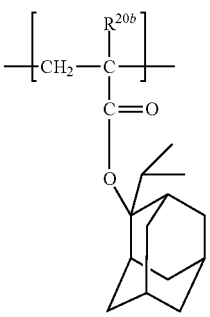 (b5-28)
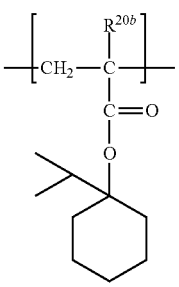 (b5-29)
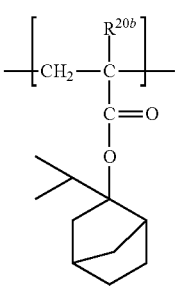 (b5-30)

(b5-31) 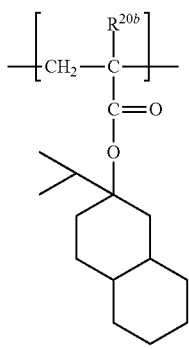
(b5-32) 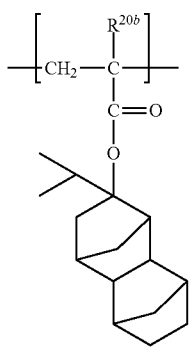
(b5-33) 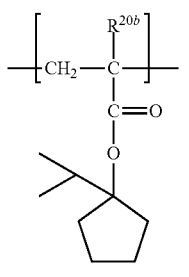
In the above formulae (b5-1) to (b5-33), $R^{20b}$ represents a hydrogen atom or a methyl group.
Preferable specific examples of the structural unit represented by the above formula (b6) include those represented by the following formulae (b6-1) to (b6-25).
[Chem. 31]
(b6-1) 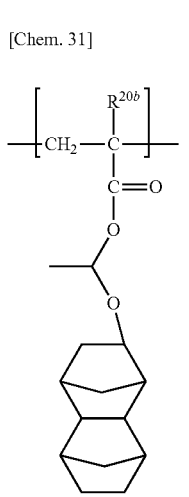
(b6-2) 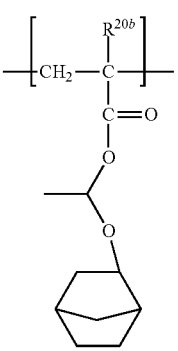
(b6-3) 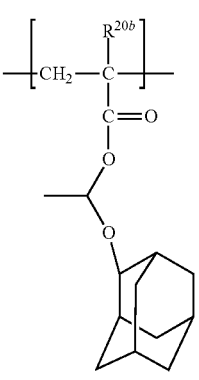
(b6-4) 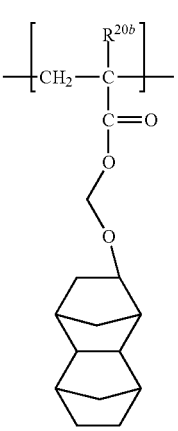
(b6-5)

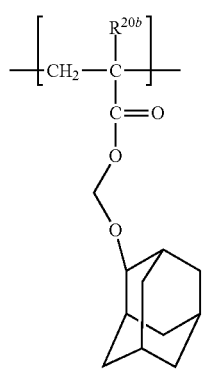 (b6-6)
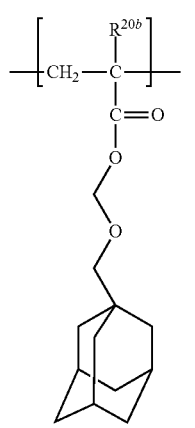 (b6-7)
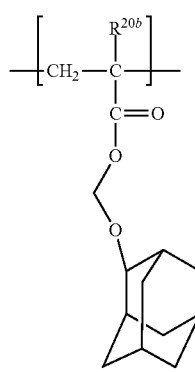 (b6-8)
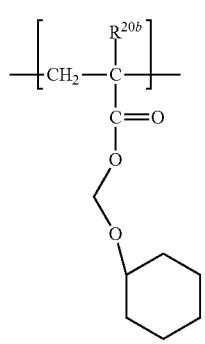 (b6-9)
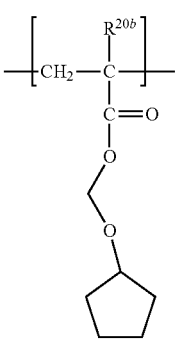 (b6-10)
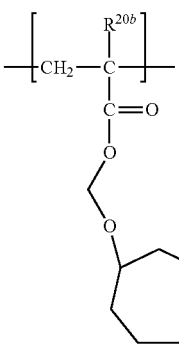 (b6-11)
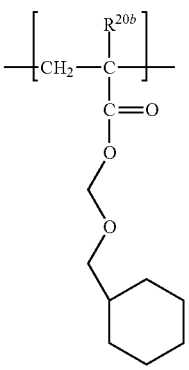 (b6-12)
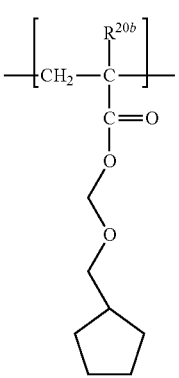 (b6-13)

(b6-14) 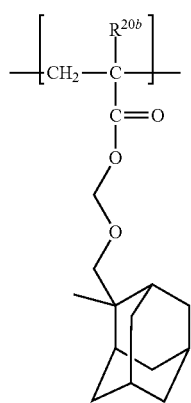
(b6-15) 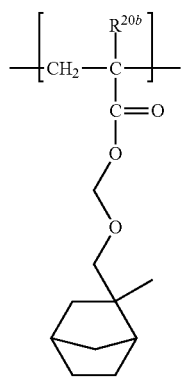
(b6-16) 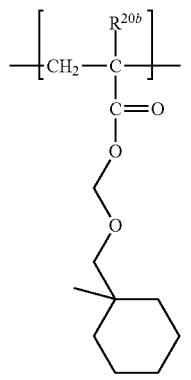
(b6-17) 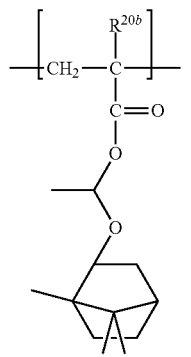
(b6-18) 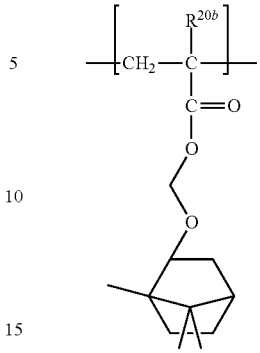
(b6-19) 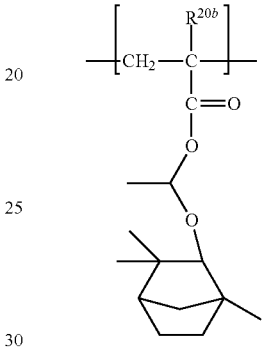
(b6-20) 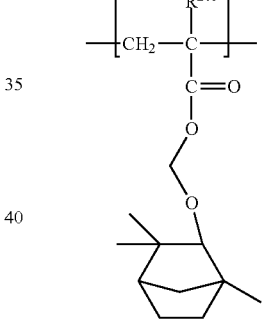
(b6-21) 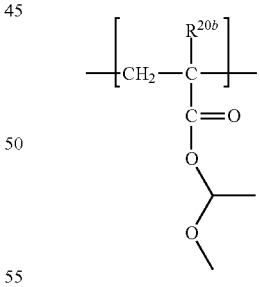
(b6-22) 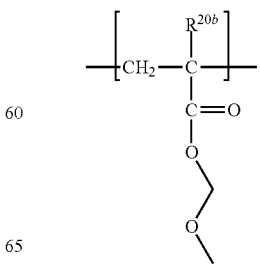

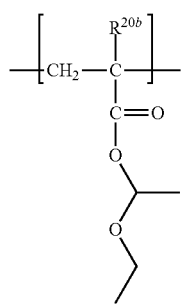
(b6-23)
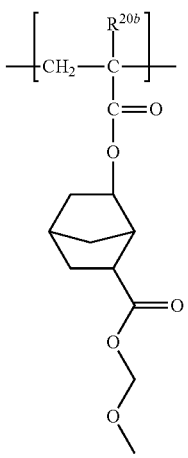
(b7-1)
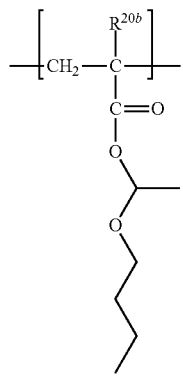
(b6-24)
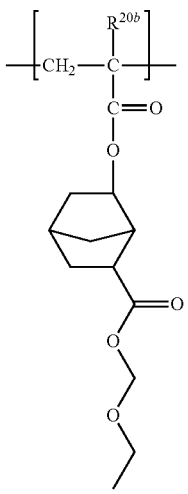
(b7-2)
(b6-25)
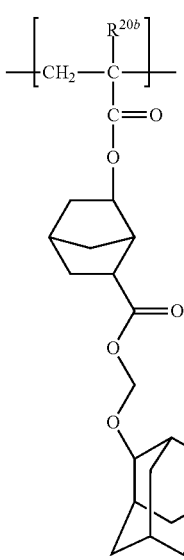
(b7-3)
In the above formulae (b6-1) to (b6-25), $R^{20b}$ represents a hydrogen atom or a methyl group.
Preferable specific examples of the structural unit represented by the above formula (b7) include those represented by the following formulae (b7-1) to (b7-15).

(b7-4)
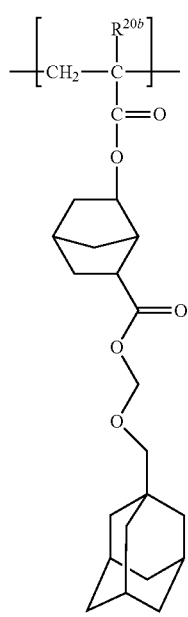
(b7-6)
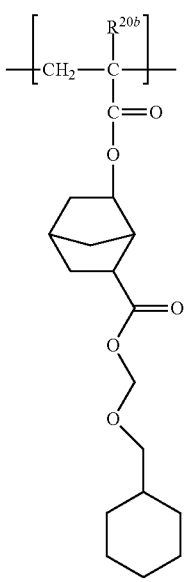
(b7-5)
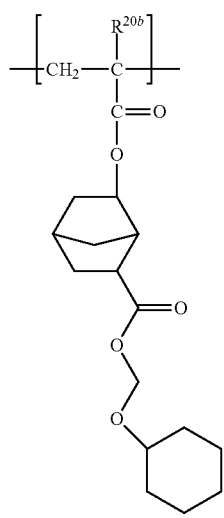
(b7-7)
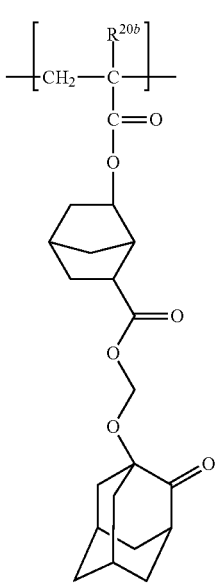

(b7-8)
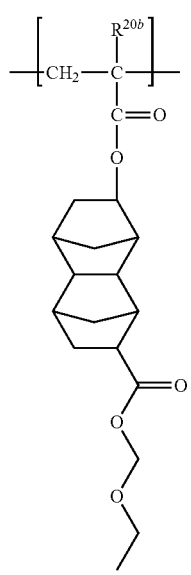
(b7-9)
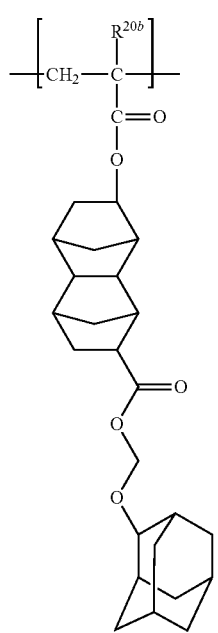
(b7-10)
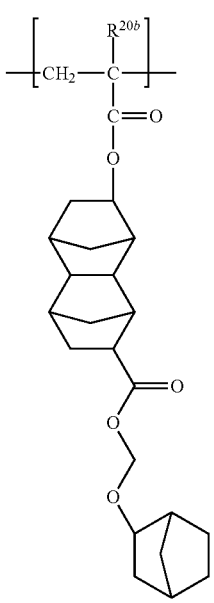
(b7-11)
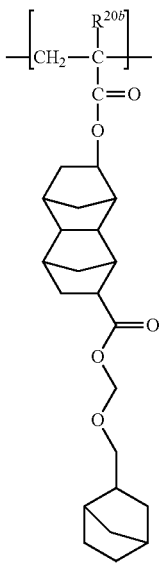

(b7-12) 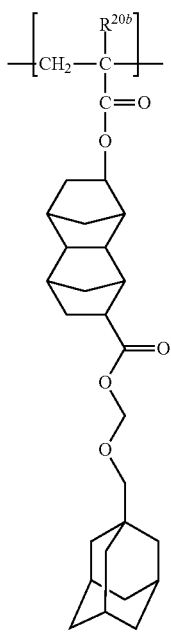

(b7-13) 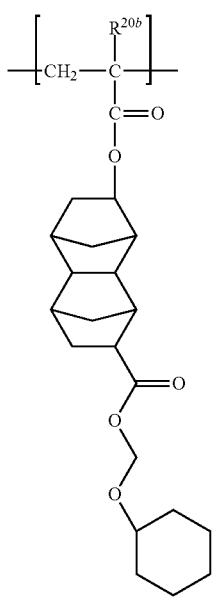

(b7-14) 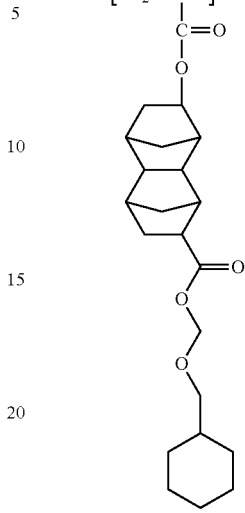

(b7-15) 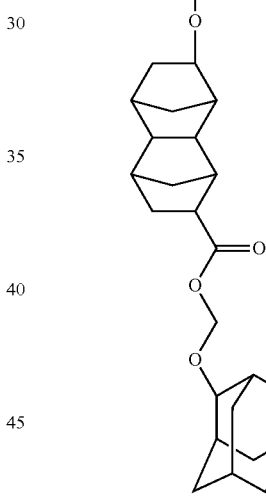

In the above formula (b7-1) to (b7-15), $R^{20b}$ represents a hydrogen atom or a methyl group.

It is also preferred that the acrylic resin (B3) includes a copolymer containing a structural unit derived from a polymerizable compound having an ether bond in addition to the structural unit represented by the above formulae (b5) to (b7).

Illustrative examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the polymerizable compound having an ether bond is preferably, 2-methoxyethyl (meth)acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl (meth)acrylate, butyl(meth)acrylate and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Furthermore, examples of the polymerizable compound include (meth)acrylic acid esters having a non-acid-dissociable aliphatic polycyclic group, and vinyl group-containing aromatic compounds. As the non-acid-dissociable aliphatic polycyclic group, particularly, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 to 5 carbon atoms as a substituent.

Specific examples of the (meth)acrylic acid esters having a non-acid-dissociable aliphatic polycyclic group include compounds having structures represented by the following formulae (b8-1) to (b8-5).

[Chem. 33]

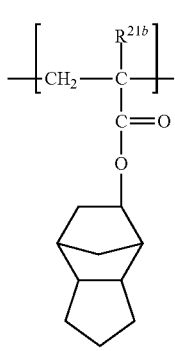

(b8-1)

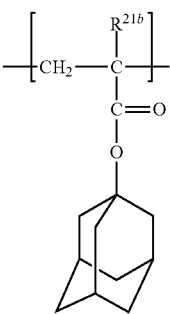

(b8-2)

-continued

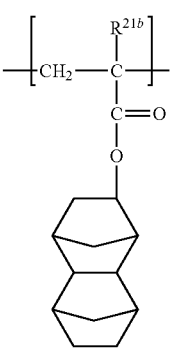

(b8-3)

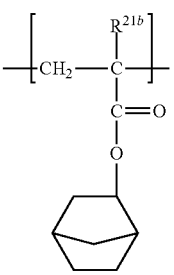

(b8-4)

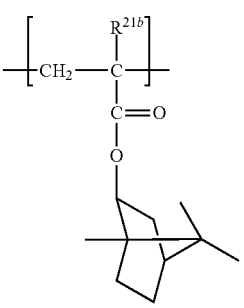

(b8-5)

In formulae (b8-1) to (b8-5) $R^{21b}$ represents a hydrogen atom or a methyl group.

Among the photosensitive resins, the acrylic resin (B3) is preferably used. Among such acrylic resin (B3), a copolymer having a structural unit represented by formula (b5), a structural unit derived from (meth)acrylic acid, a structural unit derived from a (meth)acrylic acid alkyl ester, and a structural unit derived from a (meth)acrylic acid aryl ester is preferred.

Such a copolymer is preferably a copolymer represented by the following formula (b9).

[Chem. 34]

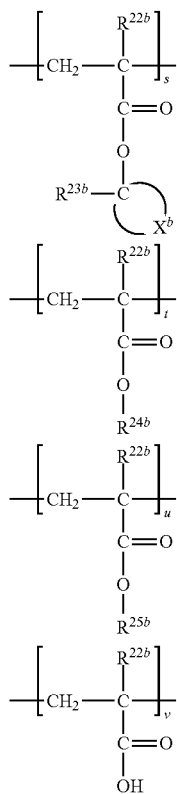

(b9)

In the formula (b9), $R^{22b}$ represents a hydrogen atom or a methyl group; $R^{23b}$ represents a linear or a branched alkyl group having 2 to 4 carbon atoms; $X^b$ represents a hydrocarbon ring having 5 to 20 carbon atoms formed together with a carbon atom to which it is attached; $R^{24b}$ represents a linear or branched alkyl group having 1 to 6 carbon atoms or an alkoxyalkyl group having 1 to 6 carbon atoms; and $R^{25b}$ represents an aryl group having 6 to 12 carbon atoms.

In regard to the copolymers represented by the above formula (b9), s, t, u and v represent each molar ratio of the structural unit, with s being 8 to 45% by mole, t being 10 to 65% by mole, u being 3 to 25% by mole, and v being 6 to 25% by mole.

The polystyrene equivalent mass average molecular weight of the photosensitive resin is preferably 10,000 to 600,000, more preferably 20,000 to 400,000, and still more preferably 30,000 to 300,000. By thus adjusting the mass average molecular weight, the photosensitive resin layer can maintain sufficient strength without deteriorating peel properties with supports, and also swelling of profiles in plating, and generation of cracks can be prevented.

It is also preferred that the photosensitive resin has a dispersivity of no less than 1.05. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the resin is preferably 5 to 60% by mass with respect to the total mass of the radiation-sensitive composition (2).

It is preferred that the radiation-sensitive composition (2) further contains an alkali-soluble resin in order to improve crack resistance. The alkali-soluble resin is preferably at least one selected from the group consisting of the novolac resin (C1), a polyhydroxystyrene resin (C2), and an acrylic resin (C3).

[Novolac Resin (C1)]

The novolac resin may be prepared by addition condensation between, for example, aromatic compounds having a phenolic hydroxyl group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the aldehydes include formaldehyde, furfural, benzaldehyde, nitrobenzaldehyde, acetaldehyde, and the like. The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolac resins can be enhanced still more when o-cresol is used, a hydrogen atom of a hydroxide group in the resins is substituted with other substituents, or bulky aldehydes are used.

The mass average molecular weight of the novolac resin (C1) is not particularly limited as long as the purpose of the present invention is not impaired, but the mass average molecular weight is preferably 1,000 to 50,000.

[Polyhydroxystyrene Resin (C2)]

The hydroxystyrene compound to constitute the polyhydroxystyrene resin (C2) is exemplified by p-hydroxystyrene, α-methylhydroxystyrene, α-ethylhydroxystyrene, and the like. Among these, the polyhydroxystyrene resin (C2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the polyhydroxystyrene resin (C2) is not particularly limited as long as the purpose of the present invention is not impaired, but the mass average molecular weight is preferably 1,000 to 50,000.

[Acrylic Resin (C3)]

It is preferred that the acrylic resin (C3) includes a structural unit derived from a polymerizable compound having an ether bond and a structural unit derived from a polymerizable compound having a carboxyl group.

Illustrative examples of the polymerizable compound having an ether bond include (meth)acrylic acid derivatives having an ether bond and an ester bond such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether bond is preferably, 2-methoxyethyl acrylate, and methoxytriethylene glycol acrylate. These polymerizable compounds may be used alone, or in combinations of two or more.

Illustrative examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the acrylic resin (C3) is not particularly limited as long as the purpose of the present invention is not impaired, but the mass average molecular weight is preferably 50,000 to 800,000.

The content of the alkali-soluble resin is such that when the total amount of the photosensitive resin and the alkali-soluble resin is taken as 100 parts by mass, the content is preferably 0 parts to 80 parts by mass, and more preferably 0 parts to 60 parts by mass. By adjusting the content of the (D) alkali-soluble resin to the range described above, there is a tendency for resistance to cracking to increase, and film loss at the time of development can be prevented.

The radiation-sensitive composition (2) contains an organic solvent. The kind of the organic solvent is not particularly limited as long as the purpose of the present invention is not impaired, and the organic solvent can be appropriately selected for use from the organic solvents that have been conventionally used in positive-type radiation-sensitive resin compositions.

Specific examples of the organic solvent include the solvents described for the radiation-sensitive composition (1); ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

The content of the organic solvent is not particularly limited as long as the purpose of the present invention is not impaired, but the content is determined so that the solid content is 1 to 55% by mass, for example. When the radiation-sensitive composition is used for a thick-film application in which a photosensitive resin layer obtainable by a spin-coating method or the like has a film thickness of 10 μm or greater, it is preferable to use the organic solvent to the extent that the solid concentration of the radiation-sensitive resin composition is 30% to 55% by mass.

Also, the radiation-sensitive composition (2) may further contain a surfactant for improving coating characteristics, defoaming characteristics, leveling characteristics and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the radiation-sensitive composition (2) may further contain an acid, an acid anhydride, or a solvent having a high boiling point. In order to improve sensitivity, the radiation-sensitive composition (2) may further contain a sensitizer.

(Radiation-Sensitive Composition (3))

The radiation-sensitive composition (3) is a negative-type radiation-sensitive composition that contains an alkali-soluble resin having a phenolic hydroxyl group, an acid crosslinking substance, a photoacid generator, and an organic solvent.

The alkali-soluble resin having a phenolic hydroxyl group in the radiation-sensitive composition (3) may be a polyhydroxystyrene resin, for example. The polyhydroxystyrene resin includes at least a structural unit derived from hydroxystyrene. The scope of the "hydroxystyrene" includes hydroxystyrene; and hydroxystyrene derivatives (monomers), that are hydroxystyrenes in which a hydrogen atom bonded to the α position is substituted with a substituent such as a halogen atom, an alkyl group, or an alkyl halide group and derivatives of these substituted hydroxystyrenes. The term "hydroxystyrene derivatives" refers to hydroxystyrene derivatives that retain at least the benzene ring and the hydroxyl group bonded thereto. The scope of the hydroxystyrene derivatives includes, for example, hydroxystyrene in which a hydrogen atom bonded to the α position of the hydroxystyrene is substituted with a substituent such as a halogen atom, a $C_{1-5}$ alkyl group, or an alkyl halide group; hydroxystyrene in which the benzene ring having a hydroxyl group bonded thereto further has a $C_{1-5}$ alkyl group bonded thereto; and hydroxystyrene in which the benzene ring having a hydroxyl group bonded thereto further has one to two hydroxyl groups bonded thereto (the total number of hydroxyl groups is 2 to 3). Examples of the halogen atom include a chlorine atom, a fluorine atom, and a bromine atom, and a fluorine atom is preferable. The phrase "the α position of the hydroxystyrene" refers to the carbon atom to which the benzene ring is bonded, unless otherwise indicated.

The structural unit derived from hydroxystyrene is represented by the following formula (b-1), for example.

[Chem. 35]

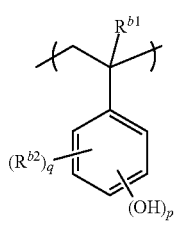

(b-1)

In the formula (b-1), $R^{b1}$ represents a hydrogen atom, an alkyl group, a halogen atom, or an alkyl halide group; $R^{b2}$ represents a $C_{1-5}$ alkyl group; p represents an integer of 1 to 3; and q represents an integer of 0 to 2.

The alkyl group represented by $R^{b1}$ preferably has 1 to 5 carbon atoms. This alkyl group is preferably a linear or branched alkyl group, and examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group is preferable for industrial production. Examples of the halogen atom include a fluorine atom, a chlorine atom, a bromine atom, and an iodine atom, and a fluorine atom is preferable. The alkyl halide group is a $C_{1-5}$ alkyl group described above in which some or all of the hydrogen atoms are substituted with halogen atoms. Among these, ones in which all of the hydrogen atoms are substituted with fluorine atoms are preferable. A linear or branched fluorinated alkyl group is preferable, a trifluoromethyl group, a hexafluoroethyl group, a heptafluoropropyl group, a nonafluorobutyl group, and the like are more preferable, and a trifluoromethyl group (—$CF_3$) is most preferable. $R^{b1}$ is preferably a hydrogen atom or a methyl group, and more preferably a hydrogen atom.

Examples of the $C_{1-5}$ alkyl group represented by $R^{b2}$ include the same ones exemplified for $R^{b1}$.

q represents an integer of 0 to 2, preferably 0 or 1, and for industrial production, particularly preferably 0. The position of $R^{b2}$ substitution may be any of the o-position, the m-position, and the p-position in the case in which q is 1, and in the case in which q is 2, may be a combination of any two of these positions.

p represents an integer of 1 to 3, preferably 1. The position of hydroxyl group substitution may be any of the o-position, the m-position, and the p-position, and from the viewpoints of availability and low cost, preferably the p-position, in the case in which p is 1;

and in the case in which p is 2 or 3, the position of hydroxyl group substitution may be a combination of any two or three of these positions.

The structural unit represented by the formula (b-1) may be used alone, or two or more kinds may be used in combination.

The proportion of the structural unit derived from hydroxystyrene in the polyhydroxystyrene resin is preferably 60 to 100 mol %, more preferably 70 to 100 mol %, and further preferably 80 to 100 mol %, relative to the amount of all the structural units of the polyhydroxystyrene resin. In the case in which the proportion is within the range described above, the resulting radiation-sensitive composition has an appropriate level of alkali solubility.

It is preferable that the polyhydroxystyrene resin further includes a structural unit derived from styrene. The "structural unit derived from styrene" refers to a structural unit resulting from cleavage of the ethylenic double bond of styrene or a styrene derivative (that does not include hydroxystyrene). The "styrene derivative" includes, for example, those in which the hydrogen atom bonded to the α position of styrene is substituted with a substituent such as a halogen atom, an alkyl group, or an alkyl halide group and those in which a hydrogen atom of the phenyl group of styrene is substituted with a substituent such as a $C_{1-5}$ alkyl group. Examples of the halogen atom include a chlorine atom, a fluorine atom, and a bromine atom, and a fluorine atom is preferable. The "a position of styrene" refers to the carbon atom to which the benzene ring is bonded, unless otherwise indicated.

The structural unit derived from styrene is represented by the following formula (b-2), for example. In the formula, $R^{b1}$, $R^{b2}$, and q each represent the same as those defined for the formula (b-1).

[Chem. 36]

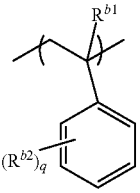

(b-2)

Examples of $R^{b1}$ and $R^{b2}$ include the same groups as those defined for $R^{b1}$ and $R^{b2}$ in the formula (b-1).

q represents an integer of 0 to 2, preferably 0 or 1, and for industrial production, particularly preferably 0. The position of $R^{b2}$ substitution is any of the o-position, the m-position, and the p-position in the case in which q is 1, and in the case in which q is 2, may be a combination of any two of these positions.

The structural unit represented by the formula (b-2) may be used alone, or two or more kinds may be used in combination.

The proportion of the structural unit derived from styrene in the polyhydroxystyrene resin is preferably 40 mol % or less, more preferably 30 mol % or less, and further preferably 20 mol % or less, relative to the amount of all the structural units of the polyhydroxystyrene resin. In the case in which the proportion is within the range described above, the resulting radiation-sensitive composition has an appropriate level of alkali solubility and, in addition, an excellent balance between the structural units is obtained.

The polyhydroxystyrene resin may further include another structural unit in addition to the structural unit derived from hydroxystyrene and the structural unit derived from styrene. More preferably, however, the polyhydroxystyrene resin is a polymer exclusively composed of the structural unit derived from hydroxystyrene or a copolymer composed of the structural unit derived from hydroxystyrene and the structural unit derived from styrene.

The mass average molecular weight of the polyhydroxystyrene resin is not particularly limited, but is preferably 1500 to 40000, and more preferably 2000 to 8000.

The alkali-soluble resin having a phenolic hydroxyl group may be a novolac resin. The novolac resin may be obtained by addition condensation of a phenol and an aldehyde in the presence of an acid catalyst.

Examples of the phenol include phenol, cresols such as o-cresol, m-cresol, and p-cresol; xylenols such as 2,3-xylenol, 2,4-xylenol, 2,5-xylenol, 2,6-xylenol, 3,4-xylenol, and 3,5-xylenol; alkylphenols such as o-ethylphenol, m-ethylphenol, p-ethylphenol, 2-isopropylphenol, 3-isopropylphenol, 4-isopropylphenol, o-butylphenol, m-butylphenol, p-butylphenol, and p-tert-butylphenol; trialkylphenols such as 2,3,5-trimethylphenol and 3,4,5-trimethylphenol; polyphenols such as resorcinol, catechol, hydroquinone, hydroquinone monomethyl ether, pyrogallol, and fluoroglycinol; alkyl polyphenols such as alkylresorcins, alkylcatechols, and alkylhydroquinones (respective alkyl groups have 1 to 4 carbon atoms); and α-naphthol, β-naphthol, hydroxydiphenyl, and bisphenol A. The phenol may be used alone, or two or more kinds may be used in combination. Among these phenols, m-cresol and p-cresol are preferable and a combination of m-cresol and p-cresol is more preferable. In the latter case, the proportion between the two phenols may be adjusted so as to control various properties such as sensitivity.

Examples of the aldehyde include formaldehyde, paraformaldehyde, furfural, benzaldehyde, nitrobenzaldehyde, and acetaldehyde. The aldehyde may be used alone, or two or more kinds may be used in combination.

Examples of the acid catalyst include inorganic acids such as hydrochloric acid, sulfuric acid, nitric acid, phosphoric acid, and phosphorous acid; organic acids such as formic acid, oxalic acid, acetic acid, diethyl sulfate, and p-toluenesulfonic acid; and metal salts such as zinc acetate. The acid catalyst may be used alone, or two or more kinds may be used in combination.

Specific examples of the resulting novolac resin include phenol-formaldehyde condensed novolac resins, cresol-formaldehyde condensed novolac resins, and (phenol-naphthol)-formaldehyde condensed novolac resins.

The mass average molecular weight of the novolac resin is not particularly limited and is preferably 1000 to 30000, and more preferably 3000 to 25000.

The alkali-soluble resin having a phenolic hydroxyl group may be a phenol-(xylylene glycol) condensed resin, a cresol-(xylylene glycol) condensed resin, or a phenol-dicyclopentadiene condensed resin, for example.

The content of the alkali-soluble resin having a phenolic hydroxyl group is preferably 20 to 80% by mass, and more preferably 35 to 65% by mass, relative to the solid content of the radiation-sensitive composition (3). In the case in which the content is within the range described above, development tends to proceed in a good balance.

The acid crosslinking substance in the radiation-sensitive composition (3) is not particularly limited, and may be a conventionally known acid crosslinking substance.

Specific examples of the acid crosslinking substance include amino resins having a hydroxyl group or an alkoxyl group, such as melamine resin, urea resin, guanamine resin, acetoguanamine resin, benzoguanamine resin, glycoluril-formaldehyde resin, (succinyl amide)-formaldehyde resin, and (ethylene urea)-formaldehyde resin. The acid crosslinking substance of this type is easily obtained by subjecting melamine, urea, guanamine, acetoguanamine, benzoguanamine, glycoluril, succinyl amide, or ethylene urea, respectively, to reaction with formalin in boiling water to cause methylolation, or by subjecting the resulting product to a further reaction with a lower alcohol to cause alkoxylation. Practically, the acid crosslinking substance may be a melamine resin such as Nikalac MX-750, Nikalac MW-30, or Nikalac MW100 LM or a urea resin such as Nikalac MX-290 (all of these are manufactured by Sanwa Chemical Co., Ltd.). A benzoguanamine resin such as Cymel 1123 or Cymel 1128 (manufactured by Mitsui Cyanamid) may also be available as a commercial product.

A benzene compound having an alkoxyl group, such as 1,3,5-tris(methoxymethoxy)benzene, 1,2,4-tris(isopropoxymethoxy)benzene, or 1,4-bis(sec-butoxymethoxy)benzene, and a phenolic compound having a hydroxyl group or an alkoxyl group, such as 2,6-dihydroxymethyl-p-tert-butylphenol, may also be used. The acid crosslinking substance may be used alone, or two or more kinds may be used in combination.

The content of the acid crosslinking substance is preferably 5 to 50 parts by mass, and more preferably 10 to 30 parts by mass, relative to 100 parts by mass of the alkali-soluble resin having a phenolic hydroxyl group. In the case in which the content is within the range described above, the resulting radiation-sensitive composition has excellent curability and excellent patterning properties.

The photoacid generator in the radiation-sensitive composition (3) is not particularly limited and may be a conventionally known photoacid generator. Examples of a preferable photoacid generator include those described for the radiation-sensitive composition (2).

The content of the photoacid generator is preferably 0.05 to 30 parts by mass, and more preferably 0.1 to 10 parts by mass, relative to 100 parts by mass of the alkali-soluble resin having a phenolic hydroxyl group. In the case in which the content is within the range described above, the resulting radiation-sensitive composition has excellent curability.

Examples of the organic solvent in the radiation-sensitive composition (3) include the organic solvents described for the radiation-sensitive composition (1). The content of the organic solvent is preferably determined so that the solid content of the radiation-sensitive composition (3) is 1 to 50% by mass, and more preferably 5 to 30% by mass. The radiation-sensitive composition (3) may contain the various additives, as needed, as in the case of the radiation-sensitive composition (1).

(Method of Preparing Resin Composition)

The resin composition is prepared by mixing the above components with a stirrer. To make the resulting resin composition homogeneous, filtration may be carried out with a membrane filter or the like.

<Step 3>

The method of forming the film of the resin composition into a pattern in the step 3 is not particularly limited as long as it is capable of forming a pattern, and may be a method in which after the completion of selective exposure of the film of the resin composition through a mask or after the completion of electron beam drawing, development is carried out to form the film of the resin composition into a pattern. The source of the ray for the exposure may be an ultraviolet light source, an active energy ray source such as an excimer laser light source, or an ultraviolet light source such as a high-pressure mercury lamp, an ultrahigh-pressure mercury lamp, a xenon lamp, or a carbon arc lamp. The dose of the ray varies depending on the composition of the resin composition and is preferably about 5 to about 2000 mJ/cm$^2$, for example. The method of development is not particularly limited and may be a dipping method or a spraying method, for example. Specific examples of the developing solution include organic developing solutions such as monoethanolamine, diethanolamine, and triethanolamine and aqueous solutions of sodium hydroxide, potassium hydroxide, sodium carbonate, ammonia, or a quaternary ammonium salt with a concentration of, for example, 0.02 to 10% by mass. For example, an aqueous solution of tetramethylammonium hydroxide with a concentration of 0.05% by mass or more and 10% by mass or less, preferably 0.05% by mass or more and 3% by mass or less may be used. The resulting resist pattern after development may be subjected to post-baking for thermosetting. The temperature for post-baking is preferably 150 to 250° C.

<Step 4>

It is preferable that the first aspect further comprise the step 4 of removing the film of the silicon-containing composition along the pattern of the film of the resin composition. More specifically, the film of the silicon-containing composition may be removed by development or by etching for removal purpose, in either case with the use of the pattern of the film of the resin composition as a mask. In order to inhibit damage to the support equipped with an electrode and in order to reduce residue generation, it is preferable to carry out development of the film of the silicon-containing composition for removal purpose with the use of the pattern of the film of the resin composition as a mask. Examples of the conditions of the development for removal purpose include the same conditions described for the development in the step 3. Instead of the development for removal purpose, etching may be carried out. The etching may be dry etching (dry etching with plasma and/or a reactive ion, for example), but from the viewpoint of residue reduction, wet etching is preferable. In the case in which the step 4 is carried out by wet etching, it is preferable to use an etching liquid containing hydrogen peroxide. For promoting the etching for removal purpose, it is further preferable to adjust the pH by addition of an acid or a base. Examples of the pH adjuster used here may include inorganic acids such as hydrochloric acid and sulfuric acid, organic acids such as acetic acid, oxalic acid, tartaric acid, citric acid, and lactic acid, nitrogen-containing basic compounds such as ammonia, ethanolamine, and tetramethylammonium hydroxide, and nitrogen-containing organic acid compounds such as EDTA (ethylenediaminetetraacetic acid). In the case in which the step 4 is carried out by dry etching, the gas of plasma and/or a reactive ion used is not particularly limited as long as it is usually used in the field of dry etching. Examples of the gas include oxygen, halogen, and sulfur dioxide. It is preferable to use an oxygen-containing plasma and/or an oxygen-containing reactive ion because these give high resolution of the resulting pattern and are used generally.

The method of dry etching is not particularly limited. Examples thereof may include known methods, such as chemical etching (downflow etching and chemical dry etching, for example); physical etching (sputter etching and ion beam etching, for example); and chemical and physical etching (RIE (reactive ion etching), for example).

In the first aspect, the step 3 and the step 4 may be preferably carried out simultaneously as described above. The specific procedure may be as follows: after selective exposure of the film of the resin composition through a mask is completed, development is carried out to form the film of the resin composition into a pattern and at the same time remove the film of the silicon-containing composition along the resulting pattern.

<Applications>

The method of pattern formation according to the first aspect is used suitably for production of, for example, touch panels, light-emitting devices (for example, EL devices), display devices (for example, liquid crystal display devices), and organic semiconductor devices, all of which are equipped with an electrode-equipped support.

EXAMPLES

Below, the present invention will be described in more detail with reference to Examples, but the present invention shall not be limited to these Examples.

[Synthesis Example 1] Synthesis of Polysilane-Polysiloxane Resin

In a round flask with a volume of 1000 ml equipped with a three-way cock, 25.0 g of granular magnesium (with a particle diameter of 20 to 1000 μm), 21.4 g of anhydrous lithium chloride, and 4.1 g of ferric chloride were placed. The resultant was heated to 50° C. and brought to reduced pressure at 1 mmHg (=133 kPa) for drying the reaction mixture. Then, dry argon gas was introduced into the reactor. Thereto, 500 ml of tetrahydrofuran dried in advance with sodium benzophenone ketyl was added, followed by stirring at room temperature for about 30 minutes. To the resulting reaction mixture, 105.8 g (0.50 mol) of methylphenyl dichlorosilane purified in advance by distillation was added, followed by stirring at 20° C. for about 18 hours. After the completion of the reaction, 300 ml of tetrahydrofuran was added thereto. Then, the resultant was filtered under reduced pressure for removing magnesium chloride generated by the reaction and excess magnesium. The resulting filtrate was washed with 200 ml of deionized water 10 times, followed by drying the tetrahydrofuran phase over anhydrous magnesium sulfate. Then, tetrahydrofuran was distilled off. Thus, 50 g of a methylphenylsilane polymer was obtained. The resulting methylphenylsilane polymer was dissolved in 300 g of cyclohexyl acetate, to which 200 g of a 27%-by-mass aqueous triethylamine solution was added and mixed. After 60 minutes of stirring, the organic phase containing the methylphenylsilane polymer and the aqueous phase containing triethylamine were separated from each other. The organic phase containing the methylphenylsilane polymer was washed with 200 ml of deionized water three times, followed by distillation for removal of solvent components. Thus, 48 g of a methylphenylsilane polymer was obtained. The resulting polymer (polysilane compound) was defined as polymer (A0-1).

Subsequently, to a mixture of 190 g of cyclohexyl acetate and 1 g of 70%-by-mass nitric acid, a mixture of 17.0 g of methyltrimethoxysilane, 5.0 g of phenyltrimethoxysilane, 45.7 g of tetramethoxysilane, and 6 g of the polymer (A0-1) was added. The resultant was maintained at 40° C. for 12 hours for hydrolysis-condensation. After the completion of the reaction, 300 g of cyclohexyl acetate was added, followed by distillation under reduced pressure for removal of by-product alcohol and excess water. Thus, 300 g of a solution of a polysilane-polysiloxane resin (A3-1) (Mw, 2900) in cyclohexyl acetate was obtained.

[Preparation Example 1] Preparation of Silicon-Containing Composition 1

The resulting solution of the polysilane-polysiloxane resin (A3-1) in cyclohexyl acetate was filtered through a fluoro resin filter having a pore size of 0.1 μm. Mono(triphenylsulfonium) maleate and maleic acid were added thereto, respectively in an amount of 1% by mass relative to the amount of the polysilane-polysiloxane resin (A3-1). Thus, a silicon-containing composition 1 was prepared.

[Synthesis Example 2] Synthesis of Alkali-Soluble Resin

As an alkali-soluble resin used in either of Example 1 and Comparative Example 1, a resin (A-1) synthesized by a method described below was used. In a 500-ml four-necked flask, 235 g of a bisphenol fluorene epoxy resin (with an epoxy equivalent weight of 235), 110 mg of tetramethylammonium chloride, 100 mg of 2,6-di-tert-butyl-4-methylphenol, and 72.0 g of acrylic acid were placed. With air being blown into the flask at a rate of 25 ml/minute, the mixture was heated at 90 to 100° C. for dissolution. The resulting solution, which was cloudy and whitish, was gradually heated to 120° C. for thorough dissolution. Stirring was continued as the solution gradually became transparent and viscous. The heating and stirring was continued with the acid value was measured, until the acid value became below 1.0 mgKOH/g. It took 12 hours until the acid value reached the desired value. The resultant was cooled to room temperature, and thus a colorless, transparent, and solid bisphenol fluorene epoxy acrylate represented by the following formula (a-4) was obtained.

[Chem. 37]

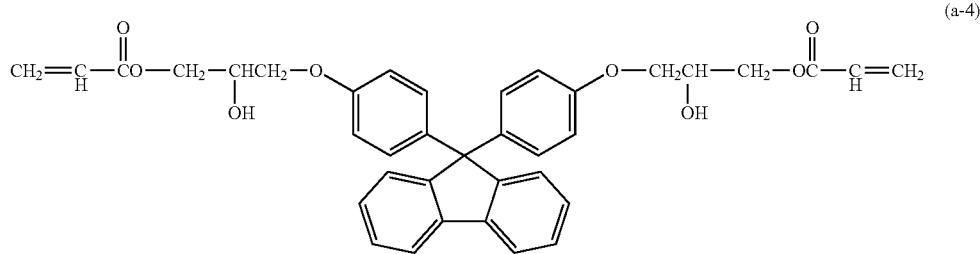

(a-4)

To 307.0 g of the resultant bisphenol fluorene epoxy acrylate, 600 g of 3-methoxybutyl acetate was added and dissolved. Then, 80.5 g of benzophenone tetracarboxylic dianhydride and 1 g of tetraethylammonium bromide were added thereto and mixed. The temperature was gradually raised to reach 110 to 115° C., at which reaction was allowed to proceed for 4 hours. After disappearance of an acid anhydride group was confirmed, 38.0 g of 1,2,3,6-tetrahydrophthalic anhydride was added thereto and mixed, followed by reaction at 90° C. for 6 hours. Thus, the resin (A-1) was obtained. The disappearance of an acid anhydride group was confirmed by IR spectrometry. The resin (A-1) corresponds to the resin represented by the formula (a-1).

[Preparation Example 2] Preparation of Resin Composition 1

As a colorant, a carbon black dispersion (with a solid content of 25% by mass) was used that was prepared by dispersing carbon black in 3-methoxybutyl acetate. After 100 parts by mass of the alkali-soluble resin (resin (A-1)), 35 parts by mass of a photopolymerizable monomer (dipentaerythritol hexaacrylate, DPHA), 15 parts by mass of a photopolymerization initiator represented by the following formula, and 500 parts by mass of the carbon black dispersion were mixed together, the resulting mixture was diluted with an organic solvent to achieve a solid content of 15% by mass. Thus, a resin composition 1 was obtained. As the organic solvent for diluting the mixture, a mixed solvent prepared by mixing 3-methoxybutyl acetate (MA), propylene glycol monomethyl ether acetate (PM), and cyclohexanone (AN) (MA/PM/AN=60/20/20 (mass ratio)) was used.

[Chem. 38]

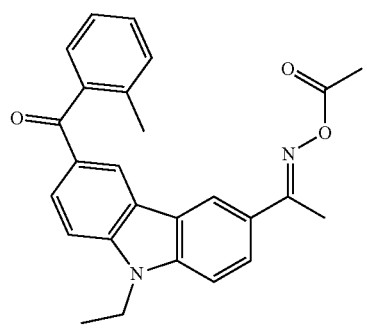

Example 1

Sputtering was carried out to apply ITO with 2000 Å to a glass substrate (glass 1737 manufactured by Dow Corning Corporation) in such a way that the surface resistance was 10Ω. Thus, a glass substrate with an ITO layer formed thereon was obtained. To the resulting glass substrate with an ITO layer formed thereon, the silicon-containing composition 1 was spin coated. The resultant was pre-baked on a hot plate at 100° C. for 120 seconds and then baked at 240° C. for 160 seconds, and thus a film of the silicon-containing composition with a film thickness of 500 nm was formed.

To the resulting film of the silicon-containing composition, the resin composition 1 was spin coated. The resultant was pre-baked on a hot plate at 100° C. for 120 seconds, and then subjected to exposure through a mask with a mirror projection aligner (manufactured by Topcon Corporation under the trade name of TME-150RTO) at an exposure dose of 50 mJ/cm², followed by development for 60 seconds with the use of a 0.04%-by-mass potassium hydroxide developing solution. Thus, patterning of the film of the resin composition and development of the film of the silicon-containing composition for removal purpose along the pattern were carried out simultaneously. As a result, a black matrix with a trace width of 10 μm was formed.

Example 2

On a glass substrate with an ITO layer formed thereon as described above, a black matrix was formed in the same manner as in Example 1 except that a 10%-by-mass TMU (N,N,N',N'-tetramethylurea) solution of a reaction product of 3-aminopropyltriethoxysilane and phthalic anhydride (1:1) was used as a silicon-containing composition 2, instead of the silicon-containing composition 1, and the film thickness after pre-baking was 1 μm.

Comparative Example 1

On a glass substrate with an ITO layer formed thereon as described above, a black matrix was formed in the same manner as in Example 1 except that no film of a silicon-containing composition was formed on the glass substrate with an ITO layer formed thereon and, instead, the resin composition 1 was directly spin coated to the glass substrate with an ITO layer formed thereon and then exposure and development were carried out for forming the black matrix.

The glass substrate with ITO and with a pattern of the black matrix formed thereon obtained in each of Examples 1 and 2 and Comparative Example 1 was observed on the surface with an optical microscope (under magnification of 100 times) for any post-development residue. A plurality of post-development residues were observed on the surface of the glass substrate with ITO of Comparative Example 1. No post-development residue was observed on the surface of the glass substrate with ITO of either Example 1 or 2.

What is claimed is:

1. A method of pattern formation, comprising:
   forming a film of a silicon-containing composition on a support equipped with an electrode using a silicon-containing composition;
   forming a film of a resin composition on the film of a silicon-containing composition; and
   forming the film of a resin composition into a pattern,
   wherein the silicon-containing composition comprises at least one selected from the group consisting of compounds represented by the following formula (I); and
   hydrolyzed products, condensates, or hydrolysis-condensation products of at least one alkoxysilane including a compound represented by the formula (I):

HOOC—X—Z—Y—Si(OR$^a$)$_3$      (I)

wherein X represents a divalent group obtained by removing one hydrogen atom each from two ring carbon atoms of an aromatic ring group or of an alicyclic group, or an alkylene group optionally having a branched chain and/or a double bond; Z represents —NHCO— or —CONH—; Y represents a single bond, an alkylene group, an arylene group, or —R$^{Y1}$—NH—R$^{Y2}$— (wherein R$^{Y1}$ and R$^{Y2}$ independently represent an alkylene group); R$^a$ independently represents a hydrocarbon group; and X and/or Y optionally has, as a substituent, at least one group selected from the group consisting of a (meth)acrylic group, a vinyl group, and an epoxy group.

2. The method according to claim 1, further comprising removing the film of a silicon-containing composition along the pattern of the film of a resin composition.

3. The method according to claim 2, wherein forming the film of a resin composition into a pattern and removing the film of a silicon-containing composition are carried out simultaneously.

* * * * *